United States Patent
Suguro et al.

(10) Patent No.: US 7,179,569 B2
(45) Date of Patent: Feb. 20, 2007

(54) METHOD FOR MANUFACTURING A SEMICONDUCTOR DEVICE, STENCIL MASK AND METHOD FOR MANUFACTURING THE SAME

(75) Inventors: Kyoichi Suguro, Yokohama (JP); Takeshi Shibata, Kawasaki (JP); Kazuyoshi Sugihara, Miura-gun (JP); Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 10/886,656

(22) Filed: Jul. 9, 2004

(65) Prior Publication Data
US 2004/0248044 A1 Dec. 9, 2004

Related U.S. Application Data

(62) Division of application No. 09/984,475, filed on Oct. 30, 2001, now Pat. No. 6,770,402.

(30) Foreign Application Priority Data
Oct. 31, 2000 (JP) .............................. 2000-333914
Sep. 21, 2001 (JP) .............................. 2001-290118

(51) Int. Cl.
*G03F 9/00* (2006.01)

(52) U.S. Cl. ......................................................... 430/5
(58) Field of Classification Search ..................... 430/5
See application file for complete search history.

(56) References Cited

U.S. PATENT DOCUMENTS

| 5,523,185 | A  | 6/1996 | Goto |
| 5,858,576 | A  | 1/1999 | Takashi et al. |
| 6,187,481 | B1 | 2/2001 | Rolfson |
| 6,210,842 | B1 | 4/2001 | Kim |

FOREIGN PATENT DOCUMENTS

JP 06-244091 * 9/1994

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

Preparing a stencil mask comprising a silicon thin film in which an opening for selectively irradiating charged particles to a semiconductor substrate is provided and whose irradiation surface on which the charged particles are irradiated is implanted with an impurity, and selectively irradiating charged particles to the semiconductor substrate using the stencil mask which is opposingly arranged on the semiconductor substrate.

14 Claims, 25 Drawing Sheets

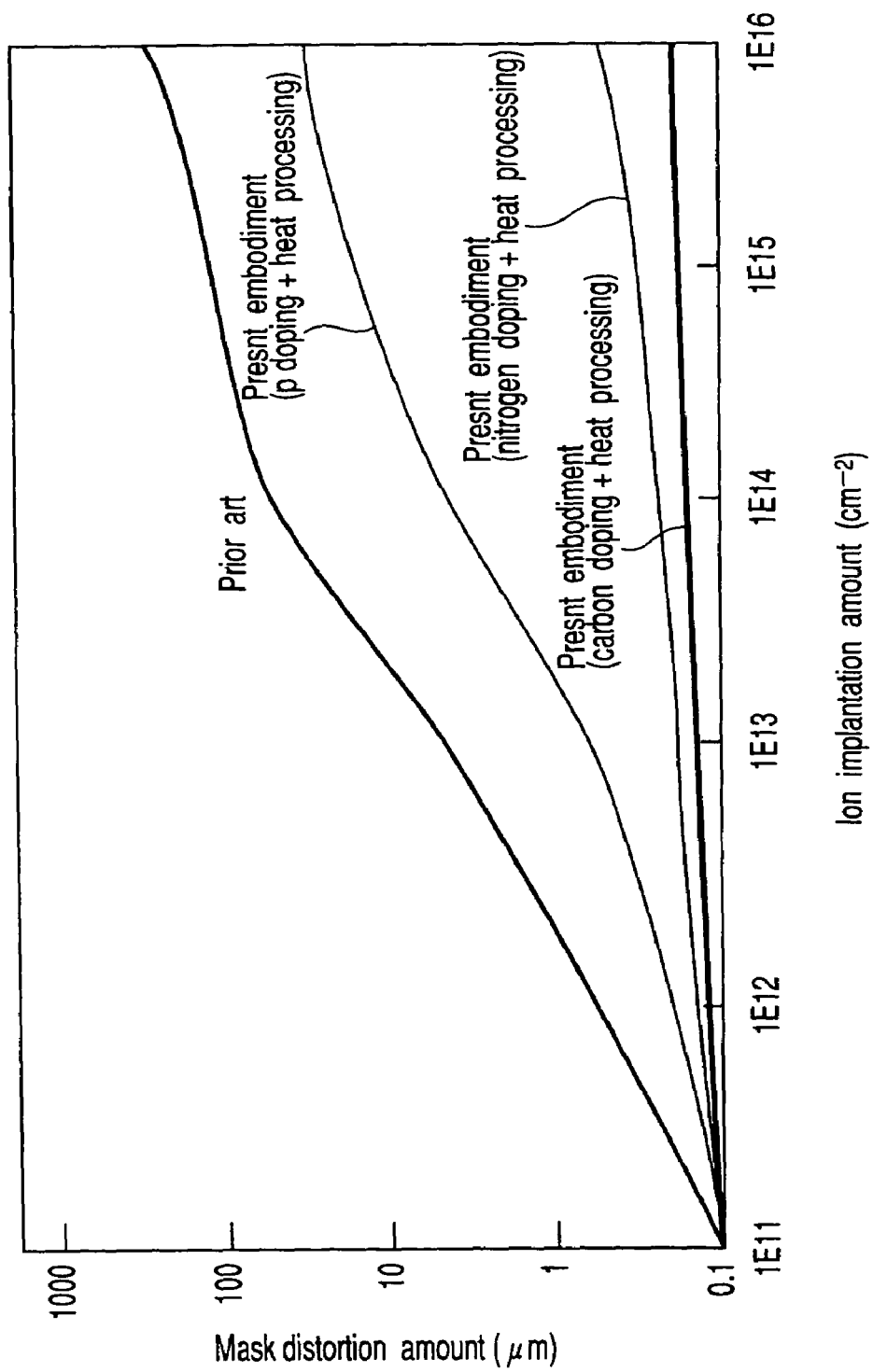
F I G. 2

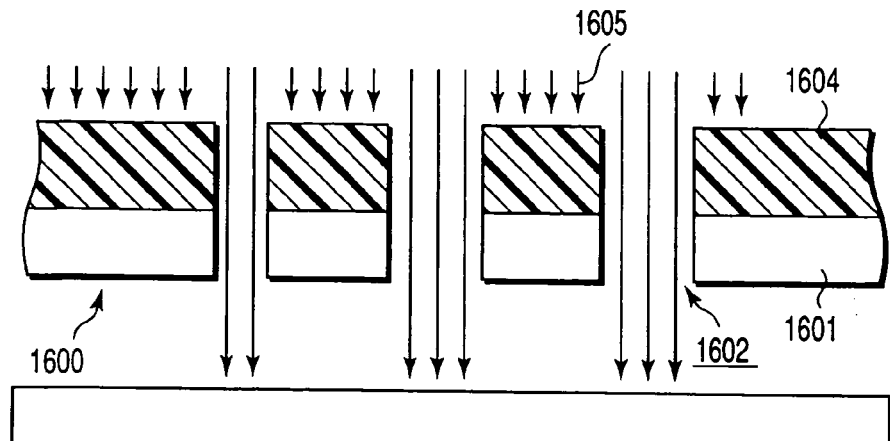
F I G. 15D
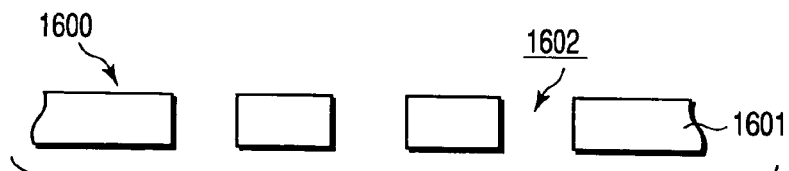
F I G. 15E
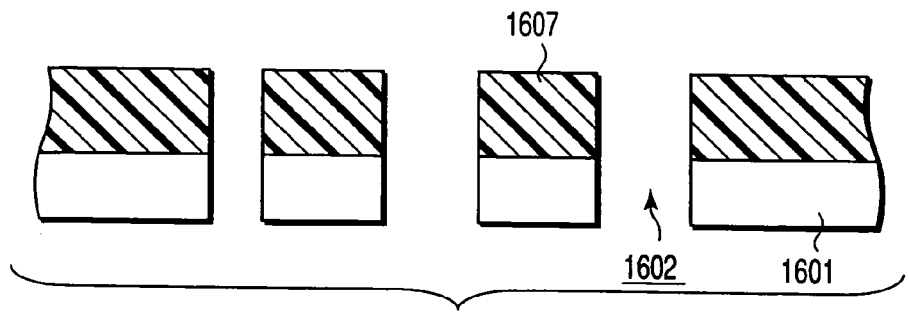
F I G. 15F
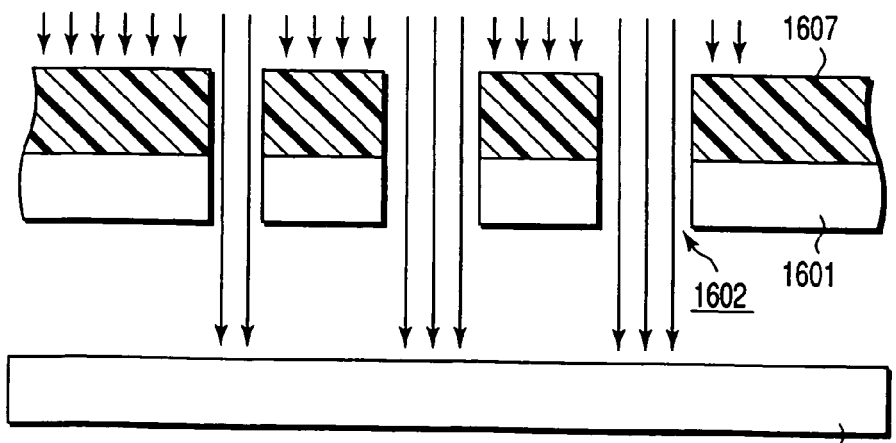
F I G. 15G

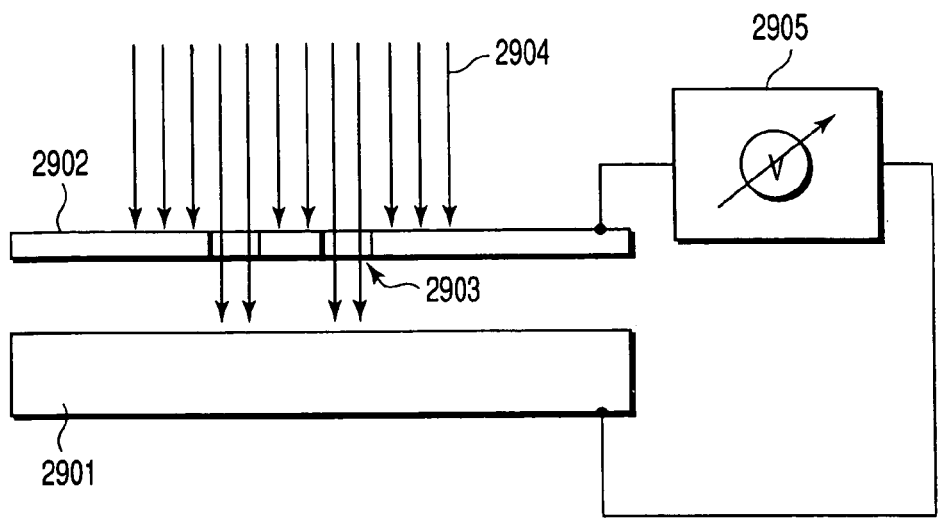
F I G. 26
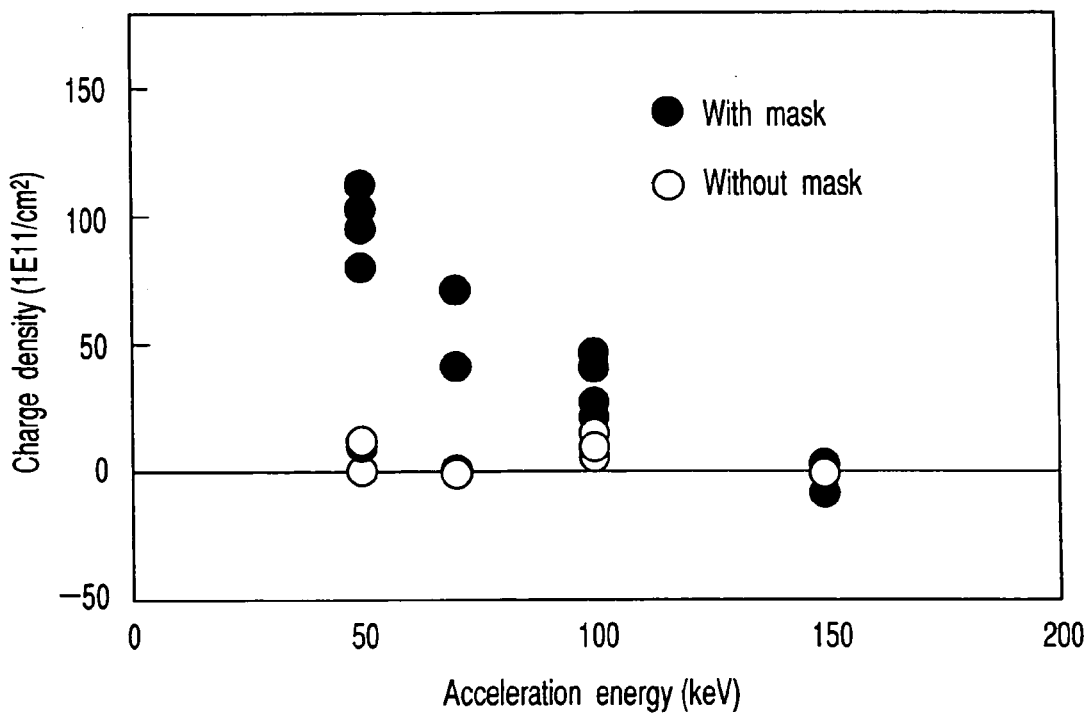
F I G. 27

METHOD FOR MANUFACTURING A SEMICONDUCTOR DEVICE, STENCIL MASK AND METHOD FOR MANUFACTURING THE SAME

This is a divisional of application Ser. No. 09/984,475, filed Oct. 30, 2001 now U.S. Pat. No. 6,770,402, upon which this application claims the benefits provided in 35 U.S.C. § 120.

CROSS-REFERENCE TO RELATED APPLICATIONS

This application is based upon and claims the benefit of priority from the prior Japanese Patent Applications No. 2000-333914, filed Oct. 31, 2000; and No. 2001-290118, filed Sep. 21, 2001, the entire contents of both of which are incorporated herein by reference.

BACKGROUND OF THE INVENTION

1. Field of the Invention

The present invention relates to method for manufacturing a semiconductor device using a stencil mask, a stencil mask used the method for manufacturing a semiconductor device, and method for manufacturing the stencil mask.

2. Description of the Related Art

There is a method in which a stencil mask (or an aperture) having an opening is set at a certain distance on a substrate and an ion implantation is carried out, in a manufacturing process of a semiconductor device, in a process where a MOSFET in which its electrically conductive types of a channel within the same substrate are different or a MOSFET in which its threshold voltages are different is manufactured, when an ion implantation of an impurity is carried out into a well, a channel or Poly-Si.

In the case where a stencil mask is used in the ion implantation process in the manufacturing for a semiconductor device, it is carried out by employing a stencil mask having an opening limited to a region for ion implantation of the object of a substrate to be processed. Specifically, in the desired ion implantation region, ions are implanted through the opening of a stencil mask, and in a region for non-ion implantation, ions are shielded by a stencil mask shielding portion. However, on the stencil mask for shielding an ion, shielded ions are accumulated by repetitive ion implantations. Damages are also accumulated by shielded ions repeatedly crushing. As a result, after a plurality of ion implantation processes, the stencil mask is deformed and the ion implantation cannot be carried out with a high precision for positions.

For example, as shown in FIG. 39, when an impurity ion 4204 is implanted into a Si substrate 4201 on which an isolation region 4202 is formed through the opening of a stencil mask 4203 interspatially installed, if a distortion is generated on the stencil mask 4203, since the position of the opening is displaced, an ion implantation region 4205 is not formed over the whole desired region, and a non-ion implantation region 4206 is formed. Moreover, depending on the shape of rough coating pattern, a problem is occurred that an n-type impurity is implanted over to a region in which a p-type region is to be formed.

As a result, the electric characteristics of a manufactured semiconductor product are varied, or the product poorly operates. Therefore, a stencil mask becomes unusable after it is used in the process of a plurality of ion implantations. The cost of manufacturing a stencil mask is converted to the cost of a manufacturing a semiconductor device, it leads to the rise of the manufacturing cost of the semiconductor device.

Moreover, in the case of a stencil mask employing a SOI substrate, since it is shielded by a thin film portion region having an opening and a supporting portion for supporting the thin film portion region in which the oxide film is an insulating film, its electrical conductivity and thermal conductivity are poor, and when it is used in the manufacturing process of a semiconductor, there has been a problem that the deformation due to the heat occurs or the ability of pattern formation is lowered due to the accumulation of charges.

By the way, in the manufacturing for a semi-conductor device employing charged particles represented by ion implantation process, it is required that the desired particles uniformly reach to the region of the object. Therefore, it is needed that the uniformity is confirmed, that is, the amount of particles is measured by spatial separation, and when it does not have the desired uniformity, the uniformity should be maintained by performing the adjustment of the particle generation source within the apparatus for manufacturing a semiconductor device and the transport system of the particles on the basis of the measured signal. Moreover, in order to maintain the uniformity of the processing state among a plurality of processing substrates, it is required that the amount of particles reaching to the processing substrate is finely and precisely measured.

For the confirmation of this uniformity and the definition of the number of the particles reached to the substrate, there is a method of confirming the state of the substrate to be processed using another measurement device by actually performing the processing to the substrate to be processed. However, in this case, since the time is taken from the processing to the measurement, it is difficult to re-adjust the device on the basis of the result.

Therefore, it is desirable that the measurement for the uniformity is performed within the device, the re-adjustment of the device is performed on the basis of the measurement of the results and the uniformity is measured again. For the measurement of the uniformity within the device, there is a method of evaluating the uniformity by measuring the output from the probes, for example, such as Faraday gauges or the like arranged in lines for measuring the electric charge amount of the particles passing through the specific region.

However, since these probes measure the valence electrons, any information concerning with the neutralized particles cannot be obtained. On the other hand, for example, in the ion implantation process, an ion may be neutralized due to the influence of the residual gas in the device, and the neutralized particles also act similarly as the ion does to the substrate to be processed. Therefore, a probe capable of measuring particles including the neutral particles has been required. Moreover, it has been desired that the spatial resolution is enhanced upon the measurement along with the miniaturization and refinement of a semiconductor element, however, it has been difficult to miniaturize a probe for it.

As described above, it has been desired that in-plane distribution of the number of the neutral particles and the charged particles reached to the semiconductor substrate is measured and the number of particles reached to the semiconductor substrate is precisely controlled.

As described above, in the case where a stencil mask is used in the ion implantation process a plurality of times, the distortion of the mask is generated, and the ion implantation position with respect to the semiconductor substrate is deviated, thereby making the electric characteristics of the semiconductor products to be varied or making the product poorly operate. Therefore, in order to lower the manufacturing cost of the semiconductor device, a stencil mask capable of being made in a cheap cost or a stencil mask having a long life has been desired.

Moreover, there has been a problem that an ability of pattern formation is lowered due to the deformation with heat and the accumulation of electric charges caused by electrification.

A device for measurement capable of measuring an in-plane distribution of the number of the neutral particles and the charged particles reached to the substrate has been required.

BRIEF SUMMARY OF THE INVENTION

The present invention is configured so as to achieve the above-described objects as the followings.

(1) According to one aspect of the present invention, there is provided a method for manufacturing a semiconductor device comprising: a method for manufacturing a semiconductor device comprising: preparing a stencil mask comprising a silicon thin film in which an opening for selectively irradiating charged particles to a semiconductor substrate is provided and whose irradiation surface on which the charged particles are irradiated is implanted with an impurity; and selectively irradiating charged particles to the semiconductor substrate using the stencil-mask which is opposingly arranged on the semiconductor substrate.

(2) According to one aspect of the present invention, there is provided a method for manufacturing a semiconductor device comprising: preparing a stencil mask comprising a metal thin film in which an opening for selectively irradiating charged particles to a semiconductor substrate is formed and a semiconductor layer formed on an irradiation surface of the metal thin film on which the charged particles are irradiated; and selectively irradiating charged particles to a semiconductor substrate using the stencil mask which is opposingly arranged on the semiconductor substrate.

(3) According to one aspect of the present invention, there is provided a method for manufacturing a semiconductor device comprising: preparing a stencil mask comprising a thin film in which an opening for selectively irradiating charged particles to a semiconductor substrate is formed and a plurality of covering layers formed on a surface of the thin film; and selectively irradiating charged particles to a semiconductor substrate using the stencil mask which is opposingly arranged on the semiconductor substrate.

(4) According to one aspect of the present invention, there is provided a method for manufacturing a semiconductor device comprising: preparing a stencil mask comprising a silicon thin film in which an opening for selectively irradiating charged particles to a semiconductor substrate is formed and an insulating layer formed on an irradiation surface of the silicon thin film on which the charged particles are irradiated; and selectively irradiating charged particles to a semiconductor substrate using the stencil mask which is opposingly arranged on the semiconductor substrate.

(5) According to one aspect of the present invention, there is provided a method for manufacturing a semiconductor device comprising: preparing a stencil mask comprising a shielding film in which an opening for selectively irradiating charged particles to a semiconductor substrate is formed and an resist film formed on an irradiation surface of the shielding film on which the charged particles are irradiated; and selectively irradiating charged particles to a semiconductor substrate using the stencil mask which is opposingly arranged on the semiconductor substrate.

(6) According to one aspect of the present invention, there is provided a method for manufacturing a semiconductor device comprising: selectively forming a first resist film on an irradiation surface of the shielding film on which charged particles are irradiated to a stencil mask having the shielding film in which an opening through which charged particles pass is provided; selectively irradiating charged particles to one or more sheets of semiconductor substrates using the stencil mask comprising the first resist film; removing a resist formed on an irradiation surface of the stencil mask; selectively forming a second resist film on an irradiation surface of the shielding film on which the charged particles are irradiated; and selectively irradiating charged particles to the semiconductor substrate once or more.

(7) According to one aspect of the present invention, there is provided a method for manufacturing a semiconductor device comprising: preparing a stencil mask comprising a thin film provided with an opening for selectively irradiating charged particles to a semiconductor substrate, depth of the opening being different corresponding to the size of the opening; and selectively irradiating charged particles to a semiconductor substrate using the stencil mask which is opposingly arranged on the semiconductor substrate.

(8) According to one aspect of the present invention, there is provided a method for manufacturing a semiconductor device comprising: preparing a stencil mask comprising a thin film in which an opening for selectively irradiating charged particles to a semiconductor substrate is provided, an insulating layer which is formed on an irradiation surface of the thin film on which the charged particles are irradiated and a supporting substrate which is formed on the thin film and the insulating layer and which is conductive to the thin film; selectively irradiating charged particles to the semiconductor substrate using the stencil mask which is opposingly arranged on a semiconductor substrate; and discharging the charged particles attached to the thin film from the stencil mask via the supporting substrate by irradiation of the charged particles.

(9) According to one aspect of the present invention, there is provided a method for manufacturing a semiconductor device comprising: selectively implanting ions to a semiconductor substrate by irradiating charged particles to the semiconductor substrate via a stencil mask comprising a thin film opposingly arranged on the semiconductor substrate and having an opening; and adjusting a potential difference between the thin film and the semiconductor substrate during irradiation of the charged particles.

(10) According to one aspect of the present invention, there is provided a method for manufacturing a semiconductor device in which particle beam including ions and neutral particles of impurity are irradiated to a semiconductor substrate installed at an irradiation position and an impurity of implantation amount D per unit area is implanted to the semi-conductor substrate, the method comprising: irradiating the particle beam to a particle amount measurement device comprising an electron generation/discharging device which is installed nearby the irradiation position in a state where the semiconductor substrate is not irradiated by the particle beam and which generates and amplifies electrons corresponding to an incident position of ions and neutral particles incident to a measurement surface and discharges the electrons from back surface side, an electron detector for measuring a position and an amount of electrons discharged from the electron generation/discharging device, and a particle amount calculation section for calculating a distribution of total particle amount of ions and neutral particles incident to a surface of the particle detector from positions and amount of electrons measured by the electron detector and irradiating the particle beam and to a beam current measurement device installed at a position different from the irradiation position for measuring current by the ions; measuring an in-plane distribution of a total particle amount of the ions and neutral particles of particle beam irradiated to the electron generation/discharging device using the particle amount measurement device; controlling an in-plane distribution of a total particle amount by adjusting a generating system for generating the particle beam and a transporting system through which the generated particle beam pass; moving the semiconductor substrate to the irradiation position; and irradiating the particle beam to the semiconductor substrate.

(11) According to one aspect of the present invention, there is provided a method for manufacturing a semiconductor device in which particle beam including ions and neutral particles of impurity are irradiated to a semiconductor substrate installed at an irradiation position and an impurity of implantation amount D per unit area is implanted to the semi-conductor substrate, the method comprising: irradiating the particle beam to a particle amount measurement device comprising an electron generation/discharging device which is installed nearby the irradiation position in a state where the semiconductor substrate is not irradiated by particle beam and which generates and amplifies electrons corresponding to an incident position of ions and neutral particles incident to a measurement surface and discharges the electrons from back surface side, an electron detector for measuring a position and an amount of electrons discharged from the electron generation/discharging device, and a particle amount calculation section for calculating a distribution of total particle amount of ions and neutral particles incident to a surface of the particle detector from positions and amount of electrons measured by the electron detector and irradiating the particle beam and to a beam current measurement device installed at a position different from the irradiation position for measuring current by the ions; finding an ion amount $N_2$ per unit area incident to the beam current measurement device from a current measured by the beam current measurement device as well as measuring total amount of particles N of ions and neutral particles incident to unit area of the measurement surface by the particle amount measurement device; finding conversion value $D_2=D\times(N_2/N)$ from the total amount of particles N, the amount of ions $N_2$ and the amount of impurity D; installing the semiconductor substrate to the irradiation position; irradiating particle beam to the semiconductor substrate to implanted an impurity into the semi-conductor substrate; measuring a current due to the ions by the beam current measurement device during implantation of the impurity and finding the amount of ions $N_2'$ from measured current; and terminating the implantation of the impurity when the amount of ions $N_2$, and the conversion value $D_2$ become equal to each other.

(12) According to one aspect of the present invention, there is provided a stencil mask comprising a silicon thin film in which an opening is formed, wherein an impurity is implanted into a surface of the silicon thin film.

(13) According to one aspect of the present invention, there is provided a stencil mask comprising: a metal thin film in which an opening is formed; a semiconductor layer formed on a surface of the metal thin film.

(14) According to one aspect of the present invention, there is provided a stencil mask comprising: a thin film in which an opening is formed; and a plurality of covering layers formed on a surface of the thin film.

(15) According to one aspect of the present invention, there is provided a stencil mask which used for an ion implantation process using a silicon thin film in which an opening is formed, wherein an insulating layer is formed on a surface of the silicon thin film.

(16) According to one aspect of the present invention, there is provided a stencil mask comprising: a thin film in which an opening through which charged particles pass is provided; and a resist film formed on an irradiation surface of the thin film on which the charged particles are irradiated.

(17) According to one aspect of the present invention, there is provided a stencil mask comprising: a thin film in which an opening through which charged particles pass is provided, the depth of the opening being different corresponding to the size of the opening.

(18) According to one aspect of the present invention, there is provided a stencil mask comprising: a thin film in which an opening for selectively irradiating charged particles to a substrate to be processed; an insulating layer formed on an irradiation surface of the thin film on which the charged particles are irradiated; and a supporting substrate formed on the thin film and the insulating layer and conductive to the thin film.

(19) According to one aspect of the present invention, there is provided a method for manufacturing a stencil mask, comprising: implanting an impurity into a surface side of a silicon thin film in which an opening is formed; and heating the silicon thin film.

(20) According to one aspect of the present invention, there is provided a method for manufacturing a stencil mask comprising: implanting an impurity into a silicon thin film surface of a SOI substrate in which a supporting substrate, an insulating layer and a silicon thin layer are stacked; patterning the silicon thin film and forming an opening through which the insulating layer is exposed on a bottom of the silicon thin film; and removing one portion of the supporting substrate and the insulating layer and exposing a bottom surface of an opening.

(21) According to one aspect of the present invention, there is provided a method for manufacturing a stencil mask comprising: implanting an impurity into one surface of a silicon substrate; heating the silicon substrate; joining a surface to which an impurity is implanted and an insulating layer formed on a supporting substrate; grinding the silicon substrate to form a silicon thin film; patterning the silicon thin film and forming an opening through which the insulating layer is exposed; implanting an impurity to a surface of the silicon thin film; heating the silicon thin film; and removing one portion of the supporting substrate and the insulating layer and exposing a bottom surface of the opening.

BRIEF DESCRIPTION OF THE SEVERAL VIEWS OF THE DRAWING

FIG. 2 is a characteristic view showing the distortion amount of a stencil mask with respect to the doping amount of impurities (phosphorus, carbon and nitrogen);

FIGS. 15A to 15G are sectional views illustrating a manufacturing process of a stencil mask according to a ninth embodiment of the present invention and a manufacturing process of a semiconductor using the stencil mask;

FIG. 26 is a schematic diagram of a configuration illustrating an ion implantation process using a stencil mask according to an eighteenth embodiment of the present invention;

FIG. 27 is a graph showing a measurement result of the residual electric charge density of a semiconductor substrate after ion implantation.

DETAILED DESCRIPTION OF THE INVENTION

Hereinafter, embodiments of the present invention will be described with reference to the drawings.

First Embodiment

Figure 1A:
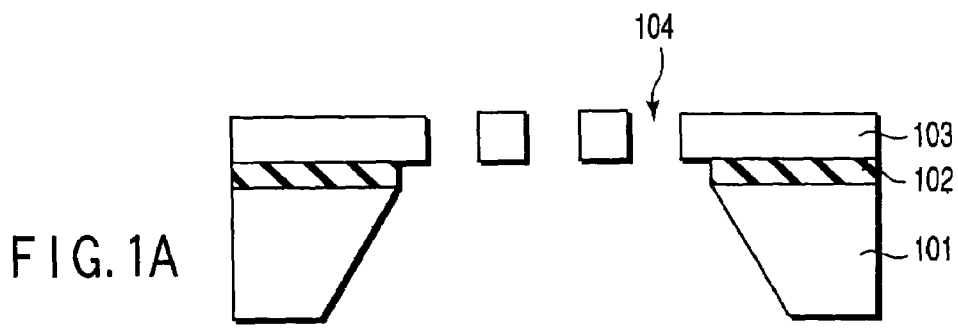
FIGS. 1A to 1C are sectional views illustrating a manufacturing process of a stencil mask according to a first embodiment of the present invention.
Figure 1B:
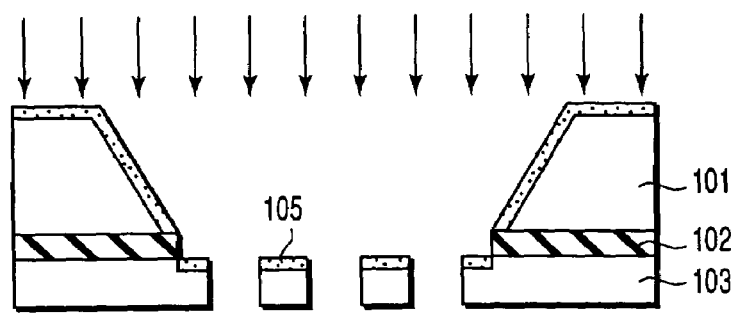
Figure 1C:
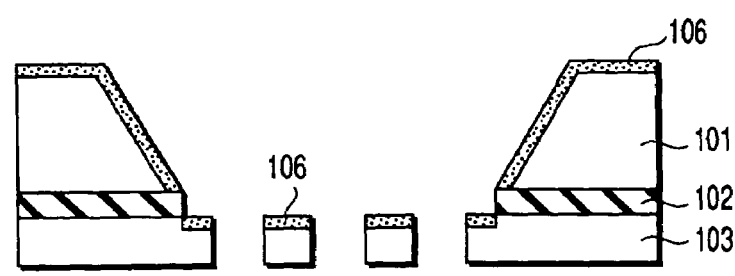

FIGS. 1A to 1C are sectional views illustrating a manufacturing process of a stencil mask according to a first embodiment of the present invention.

As shown in FIG. 1A, a stencil mask comprising a silicon thin film 103 having an opening 104 in a shape of predetermined transmission hole pattern is prepared. Reference numeral 101 denotes a silicon supporting substrate, or supporting member, reference numeral 102 denotes a silicon oxide film, and reference numeral 103 denotes a silicon thin film having a thickness of 5 to 20 µm.

Subsequently, as shown in FIG. 1B, impurity atoms such as a p-type impurity, an n-type impurity, carbon, nitrogen and the like are implanted into the surface side of the silicon thin film by employing an ion implantation method. A damaged region 105 is formed on a surface of a silicon layer by implantation of the impurity atoms. Where an impurity is implanted into the surface on which ions are irradiated when it is used as a stencil mask.

In the case of a stencil mask used in the ion implantation process, it is preferable to implant, if possible, the identical impurity of the identical electrically conductive impurity so that it is distributed deeper than doped in a silicon thin film at the time of ion implantation process. Since the depth to which ions are implanted is 0.1 to 1 µm in the ion implantation process, the depth in the silicon layer to which an impurity atom is implanted may be on the order of 0.1 to 1 µm. For example, an implantation is performed in the implantation amount of P, which is equal to more than $1 \times 10^{14}$ cm$^{-2}$.

Subsequently, as shown in FIG. 1C, after a stencil mask is heated at 550° C. for 1 hour, the temperature is raised at the rate of the order of 10° C./min. up to 900 to 1000° C., the heat is performed from about 30 minutes to about 1 hour. By this heating processing, the damaged region 105 is recrystallized, and a solid silicon layer 106 that is more solid than a silicon to which an impurity atom is not implanted is formed.

FIG. 2 shows a distortion amount of each mask to which the heat processing is performed after impurities (phosphorus, carbon and nitrogen) are doped in the surface of the silicon thin film 103. In FIG. 2, a distortion amount of a conventional mask to which the impurity doping and heat processing are not performed is also shown.

In FIG. 2, a distortion amount of the mask with respect to the amount of ion implantation at the time of ion implantation is shown. As shown in FIG. 2, it is possible that the critical ion implantation amount at which the distortion is generated is made larger by one or more places from the conventional value of $1 \times 10^{15}$ cm$^{-2}$ by performing this hardening processing.

However, in the case where a hardening layer is formed by doping oxygen, since a problem is generated that thermal energy accumulated in a stencil mask is not easily escaped due to the lowering of the heat conductivity, it is necessary to set implantation current density lower or reinforce the cooling of the substrate.

Figure 3:
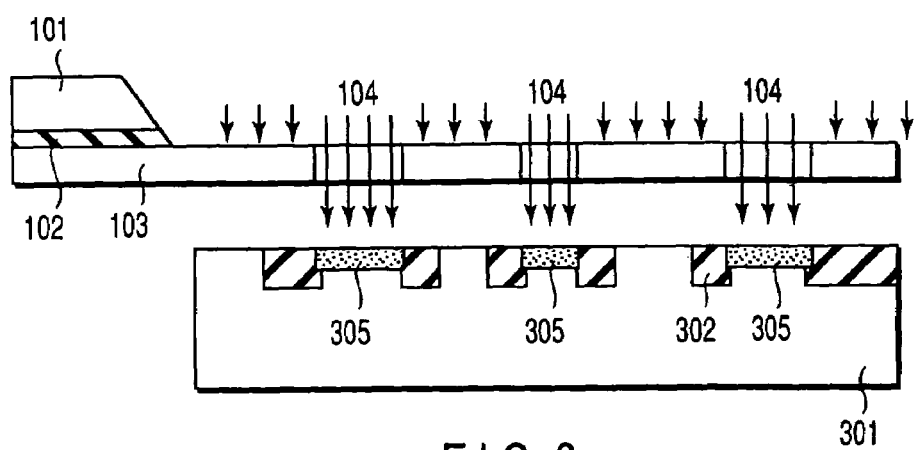
FIG. 3 is a view showing an example in which a stencil mask of the first embodiment is used in an ion implantation process.

As shown in FIG. 3, when using a stencil mask formed in the above described processes, when an impurity ion 304 is implanted into a Si substrate 301 on which an isolation region 302 is formed through an opening of the silicon thin film 103 set interspatially, since the distortion is not generated in the silicon thin film 103, the position of the opening is not displaced and an ion implantation region 305 is formed on the whole desired region.

Moreover, it is possible to use it by performing the mask distortion relaxation a plurality of times by this heat processing after a stencil mask is used.

Figure 4A:
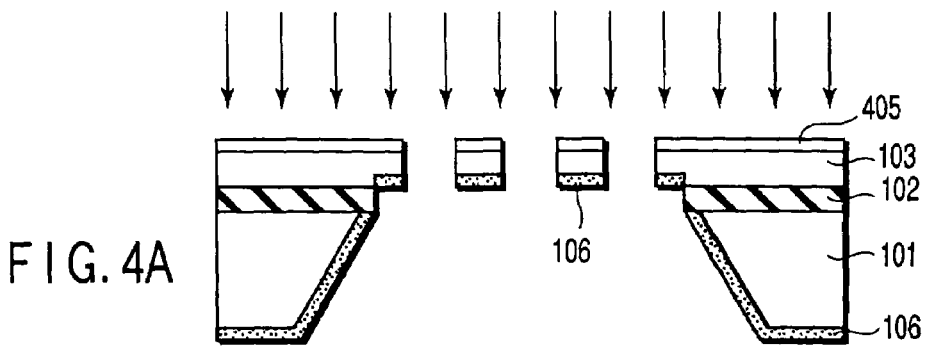
FIGS. 4A and 4B are sectional views illustrating a modified example of the manufacturing process of a stencil mask of the first embodiment.
Figure 4B:
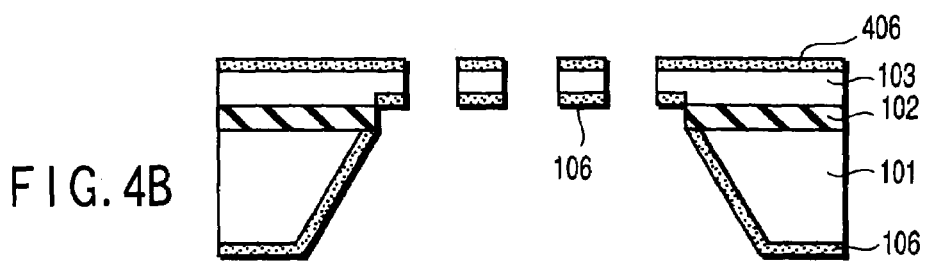

The damaged region 405 to which an impurity is implanted from the back surface (FIG. 4A), a hard silicon layer 406 to which an impurity is implanted by performing the heat processing may be formed and the hard silicon layers 106 and 406 may be formed on both surfaces (FIG. 4B).

Figure 5A:
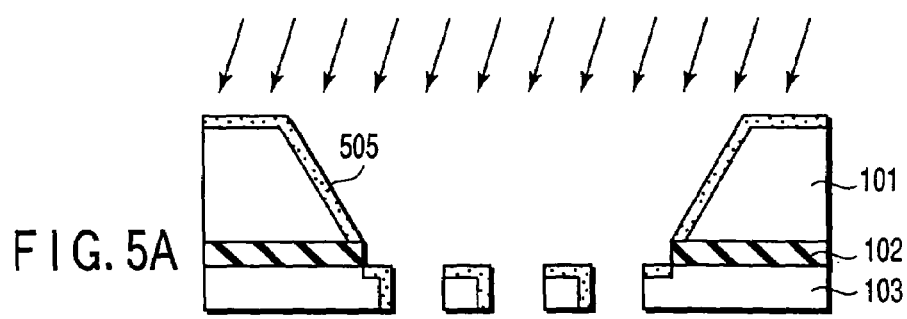
FIGS. 5A to 5C are sectional views illustrating a modified example of the manufacturing process of a stencil mask of the first embodiment.
Figure 5B:
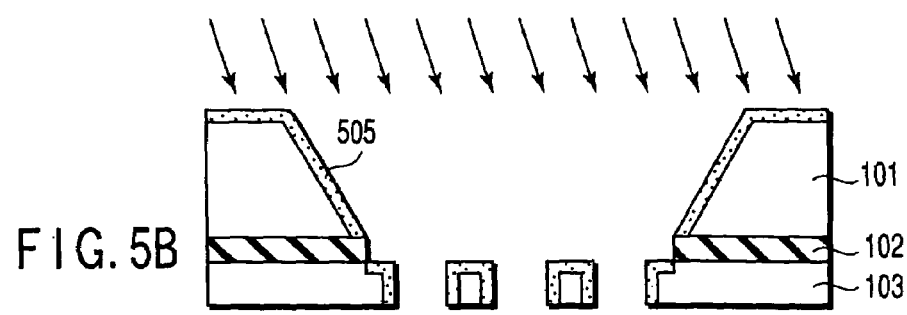
Figure 5C:
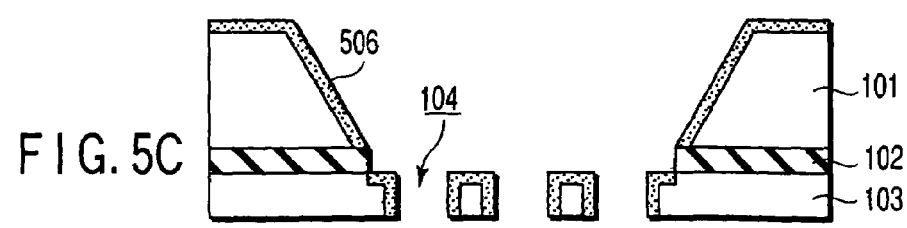

Moreover, as shown in FIGS. 5A and 5B, a damaged region 504 is formed by performing an oblique ion implantation. Then, as shown in FIG. 5C, a hard silicon layer 506 of a side wall of the opening 104 may be formed by performing the heat processing described above. A stencil mask whose strength is higher than a stencil mask whose surface of the shielding portion of the stencil mask is solely hardened is formed by constructing a structure whose side wall is also hardened.

Second Embodiment

In the present embodiment, a manufacturing process of a stencil mask different from that of the first embodiment will be described below. FIGS. 6A to 6E are sectional views illustrating a manufacturing process of a stencil mask according to a second embodiment of the present invention.

Figure 6A:
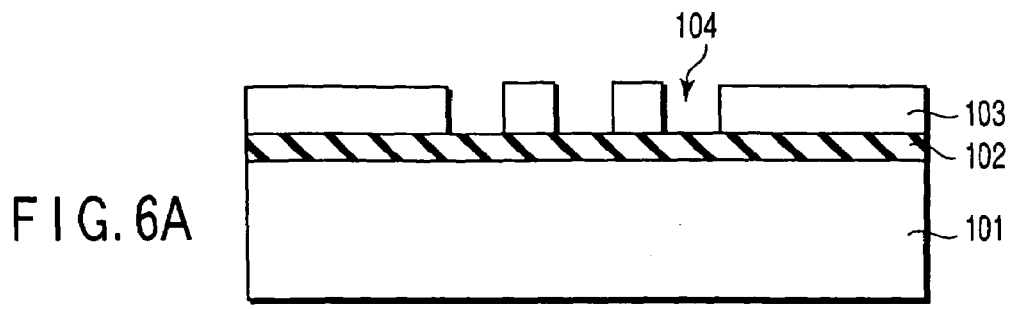
FIGS. 6A to 6E are sectional views illustrating a manufacturing process of a stencil mask according to a second embodiment of the present invention.
Figure 6B:
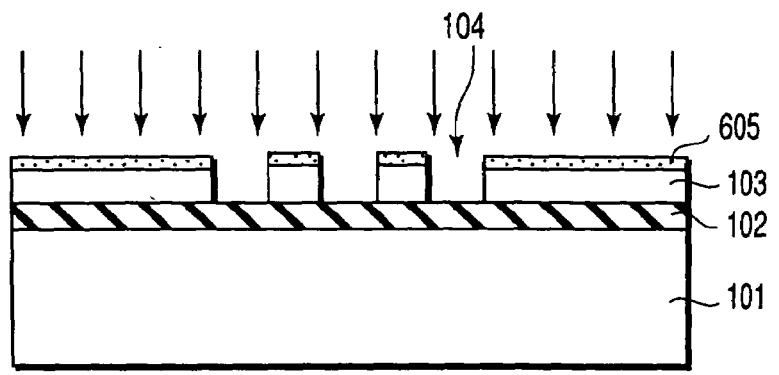

As shown in FIG. 6A, the silicon thin film 103 formed via a silicon oxide film 102 on a supporting substrate 101 made of silicon is patterned, and an opening 104 having a predetermined pattern is formed. The surface of the silicon oxide film 102 is exposed to the bottom surface of this opening 104. Subsequently, as shown in FIG. 6B, an impurity atom is implanted into the surface of the silicon thin film 103, and a damaged region 605 is formed.

Figure 6C:
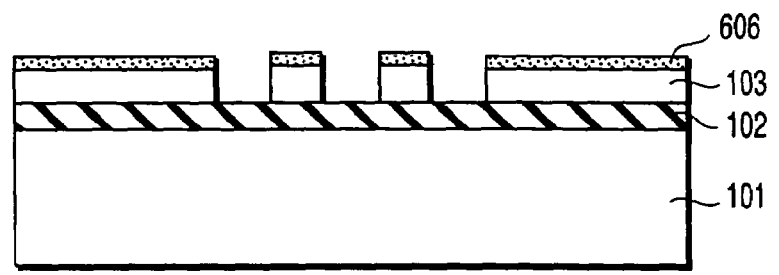

Subsequently, as shown in FIG. 6C, after the heating is performed at the temperature of 550° C. for about 1 hour, the temperature is raised at the rising temperature rate of the order of 10° C./min. up to 900 to 1000° C., the damaged region 605 is recrystallized by performing the heating for about 30 minutes to about 1 hour, and a hard silicon layer 606 is formed.

Figure 6D:
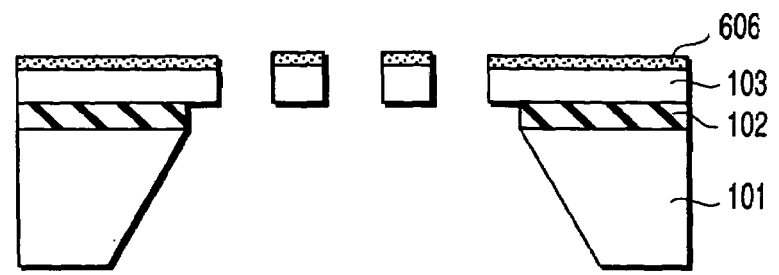

Subsequently, as shown in FIG. 6D, the silicon supporting substrate 101 and the silicon oxide film 102 are etched, and the bottom surface of the opening 104 is exposed. Since the surface of the silicon thin film 103 to be a stencil mask is hardened, the damaging of the silicon thin film 103 can be reduced in the etching processing of the silicon supporting substrate 101 and the silicon oxide film 102, therefore a stencil mask which is cheaper and thinner can be manufactured. Moreover, when the actual ion implantation process is used, the deformation of the stencil mask is reduced.

Figure 6E:
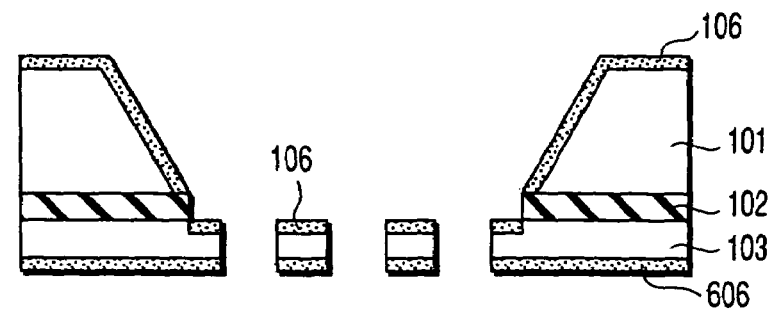

Subsequently, as shown in FIG. 6E, after an impurity atom is implanted from the side of the supporting substrate 101 into the surface of the silicon thin film 103, following the heating at the temperature of 550° C. for about 1 hour, the temperature is raised at the temperature rising rate of the order of 10° C./min. up to 900 to 1000° C., and the heating is performed from about 30 minutes to about 1 hour, thereby a hard silicon layer 106 is formed. According to the above-described processes, a stencil mask is formed.

As described above, according to the present embodiment, since the surface of the silicon thin film is hard before the removal of the supporting substrate and the silicon oxide film, the failure of the silicon thin film can be reduced.

In the present embodiment, although the surface of the silicon thin film on the side of ion implantation is further formed, it is possible to omit its formation.

Third Embodiment

In the present embodiment, a manufacturing process of a stencil mask different from those of the first and second embodiment will be described below. FIGS. 7A to 7E are sectional views illustrating a manufacturing process of a stencil mask according to a third embodiment of the present invention.

Figure 7A:
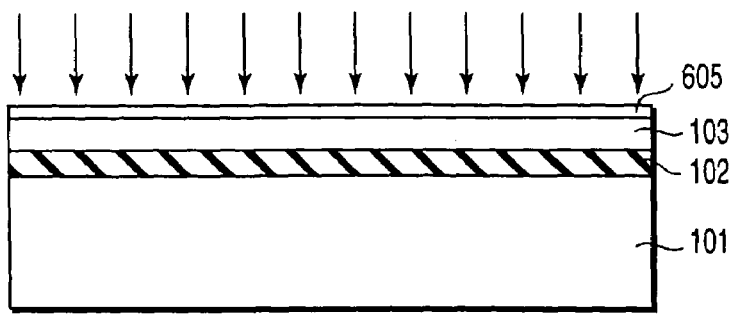
FIGS. 7A to 7E are sectional views illustrating a manufacturing process of a stencil mask according to a third embodiment of the present invention.
Figure 7B:
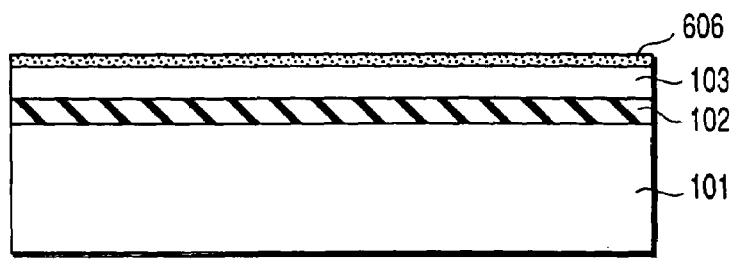

First, as shown in FIG. 7A, an impurity atom is implanted into a surface of a silicon thin film 103 formed via a silicon oxide film 102 on a supporting substrate 101 made of silicon, and a damaged region 105 is formed. Subsequently, as shown in FIG. 7B, after the heating is performed at the temperature of 550° C. for about 1 hour, the temperature is raised at the temperature rising rate of the order of 10° C./min. up to 900 to 1000° C., the heating is performed from about 30 minutes to about 1 hour, thereby recrystallizing the damaged region 105 and forming a hard silicon layer 106.

Figure 7C:
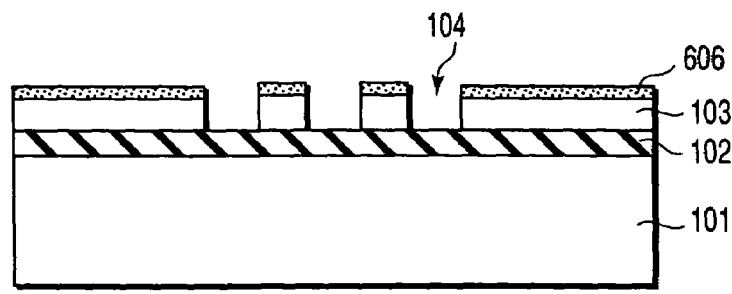

Subsequently, as shown in FIG. 7C, the hard silicon layer 106 and the silicon thin film 103 are patterned, an opening 104 of a predetermined pattern is formed. The silicon oxide film 103 is exposed to the bottom surface of the opening 104.

Figure 7D:
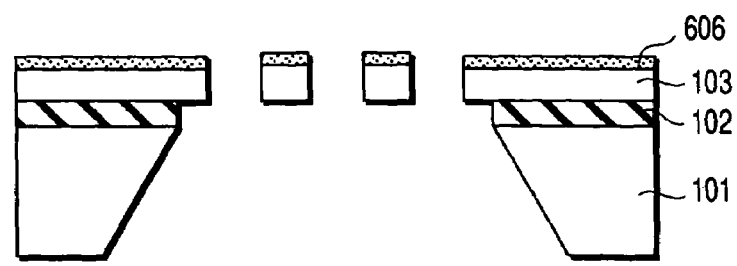

Subsequently, as shown in FIG. 7D, the silicon supporting substrate 101 and the silicon oxide film 102 are etched and the bottom surface of the opening 104 is exposed. Since the surface of the silicon thin film 103 to be a stencil mask is hardened, the damaging of the silicon thin film 103 can be reduced in the etching processing of the silicon supporting substrate 101 and the silicon oxide film 102, therefore a stencil mask which is cheaper and thinner can be manufactured. Moreover, also at the time when it is used for the actual ion implantation process, the deformation of the mask is reduced.

Figure 7E:
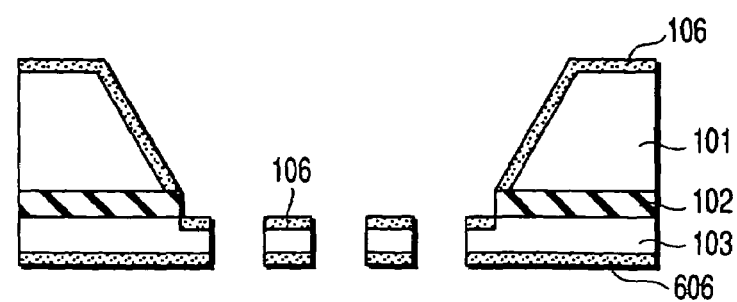

Subsequently, as shown in FIG. 7E, after an impurity atom is implanted from the side of the supporting substrate 101 into the surface of the silicon thin film 103, following the heating at the temperature of 550° C. for about 1 hour, the temperature is raised at the temperature rising rate of the order of 10° C./min. up to 900 to 1000° C., and the heating is performed from about 30 minutes to about 1 hour, thereby a hard silicon layer 106 is formed. According to the above-described processes, a stencil mask is formed.

As described above, according to the present embodiment, since the surface of the silicon thin film is hard before the removal of the supporting substrate and the silicon oxide film, the failure of the silicon thin film can be reduced.

In the present embodiment, although the surface of the silicon thin film on the side of ion implantation is further formed, it is possible to omit its formation.

Fourth Embodiment

A manufacturing process of a stencil mask of the present embodiment will be described below using FIGS. 8A to 8G. FIGS. 8A to 8G are sectional views illustrating a manufacturing process of a stencil mask according to a fourth embodiment of the present invention.

Figure 8A:
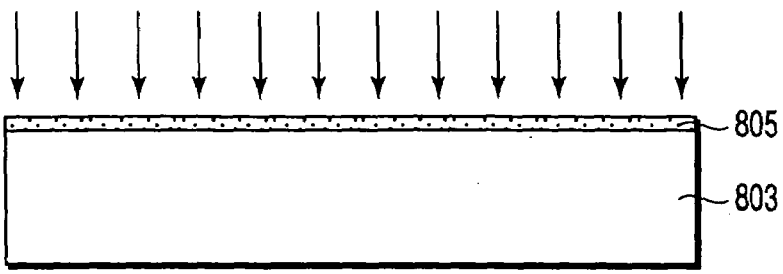
FIGS. 8A to 8G are sectional views illustrating a manufacturing process of a stencil mask according to a fourth embodiment of the present invention.

First, as shown in FIG. 8A, an impurity atom is implanted into one of the surfaces of a silicon substrate 801 using an ion implantation method. A first damaged region 805 is formed by implanting an impurity atom.

Figure 8B:

Subsequently, as shown in FIG. 8B, after the heating is performed at the temperature of 550° C. for about 1 hour, the temperature is raised at the temperature rising rate of the order of 10° C./min. up to 900 to 1000° C., the heating is performed from about 30 minutes to about 1 hour, thereby recrystallizing a first damaged region 705 and forming a first hard silicon layer 806 into which an impurity atom is implanted.

Figure 8C:
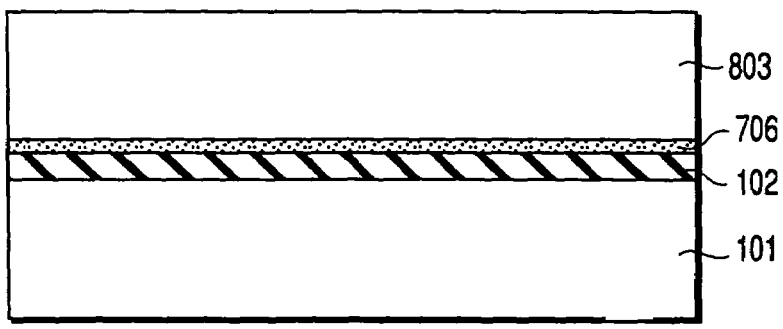

Subsequently, as shown in FIG. 8C, a first hard silicon layer 806 of the silicon substrate 801 and a silicon oxide film 102 formed on a silicon supporting substrate 101 are plastered.

Figure 8D:
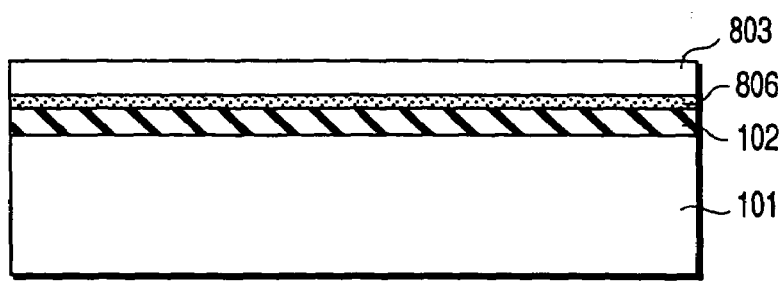

Subsequently, as shown in FIG. 8D, the silicon substrate 801 is etched and a silicon thin film 103 having a film thickness of the order of 5 to 20 μm is formed.

Figure 8E:
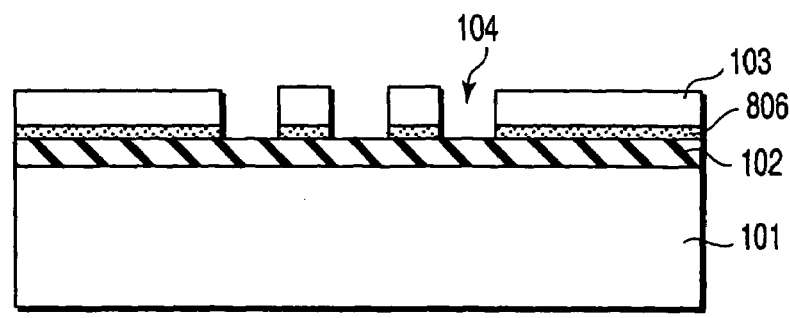
Figure 8F:
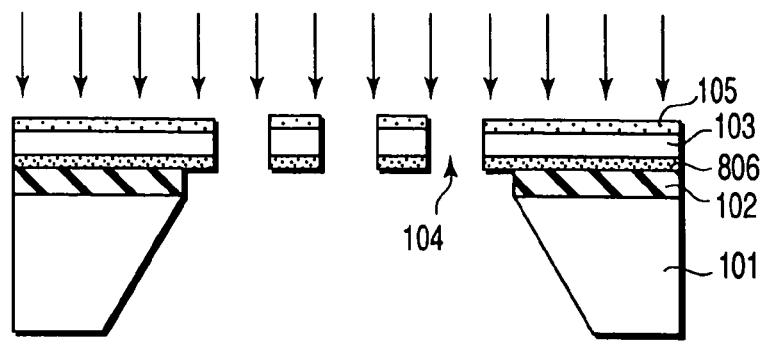

Subsequently, as shown in FIG. 8E, the silicon thin film 103 is patterned and an opening 104 of a pattern for ion implantation is formed. Subsequently, as shown in FIG. 8F, an impurity atom is implanted into the surface of the silicon thin film 103 by the ion implanted method. A second damaged region 105 is formed on the surface of the silicon thin film 103 by an impurity atom implantation. Subsequently, after the heating is performed at the temperature of 550° C. for about 1 hour, the temperature is raised at the temperature rising rate of the order of 10° C./min. up to 900 to 1000° C., the heating is performed from about 30 minutes to about 1 hour, thereby recrystallizing the second damaged region 105 and forming a hard silicon layer 106 into which an impurity atom is implanted.

Figure 8G:
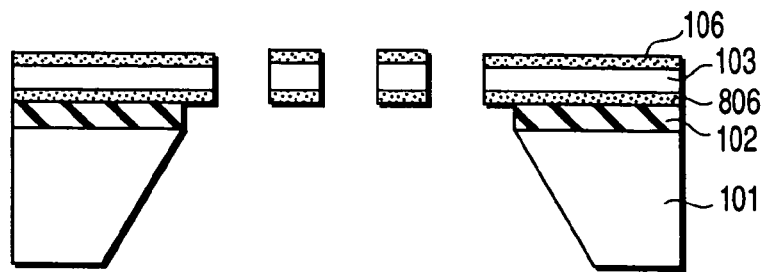

Subsequently, as shown in FIG. 8G, a stencil mask is formed by removing the silicon supporting substrate 101 and the silicon oxide film 102.

The entire silicon thin film may be hardened if the depth of ion implantation into the silicon substrate has been previously made equal to more than the thickness of the layer to be thinned.

Fifth Embodiment

Figure 9A:
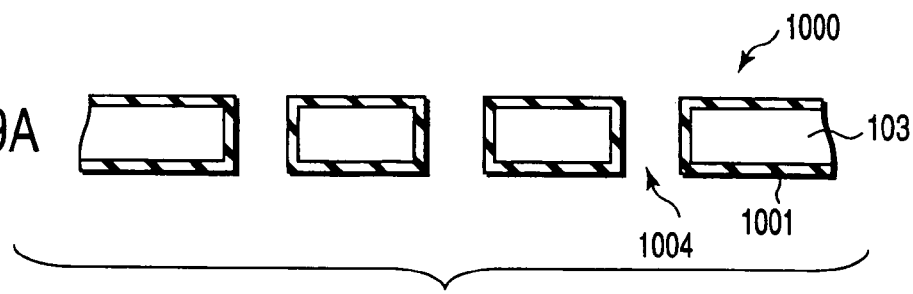
FIGS. 9A and 9B are sectional views showing a configuration of a stencil mask according to a fifth embodiment of the present invention.
Figure 9B:
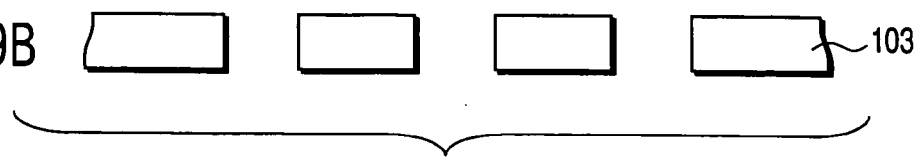

FIGS. 9A and 9B are sectional views showing a configuration of a stencil mask according to a fifth embodiment of the present invention.

As shown in FIG. 9A, for a stencil mask 1000, a surface of a silicon thin film 103 having an opening pattern 1004 for ion implantation formed by the known manufacturing process is covered by the silicon nitride film (covering layer) 1001.

Figure 10:
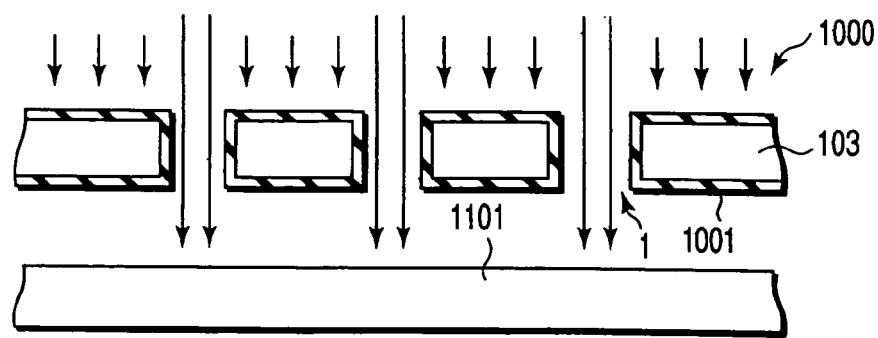
FIG. 10 is a view showing an example in which the stencil mask of the fifth embodiment of the present invention is used in an ion implantation process.

As shown in FIG. 10, in the case where the stencil mask 1000 is used in the ion implantation process applied to a semiconductor substrate 1101, shielded ions are accumulated in the silicon nitride film 1001. The stencil mask is deformed by performing an ion implantation, but in this structure, damages promoting the deformation to the silicon nitride film 1001 and ions implanted as impurities are accumulated.

Now, in a structure of the present invention, damages due to the ion implantation process and impurities implanted can be selectively removed by selectively removing the silicon nitride film 1001 covering the surface from the silicon thin film 103 which is present inside (FIG. 9B). Then, by covering again the silicon thin film 103 with the silicon nitride film 1001, the original stencil mask is generated and can be returned to the original state shown in FIG. 9A.

According to the present embodiment, since a silicon nitride film which is harder than silicon is formed on the surface of the silicon thin film, even if the ion beam is irradiated, it is not easily to be deformed. Moreover, it can be reproduced by selectively removing the silicon nitride film into which the damage is introduced at the time of the ion implantation process and again covering the surface of the silicon thin film.

Now, it is desired that the film thickness of the silicon nitride film 1001 covering the silicon thin film 103 is made a film thickness within which the shielded implantation ion remains in the silicon nitride film 1001, it may be decided corresponding to the acceleration energy of ion and the like.

It is possible to employ an insulator except for silicon nitride film. However, it is preferable that it is an insulator including silicon for the purpose of preventing a semiconductor device from being polluted.

Sixth Embodiment

Figure 11A:
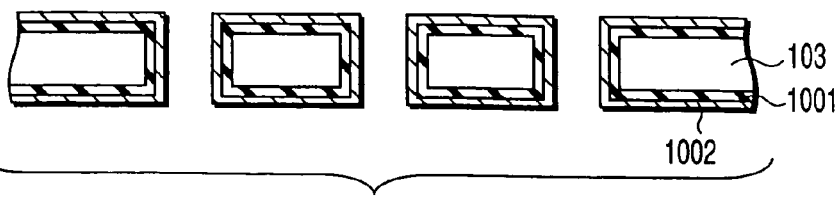
FIGS. 11A to 11C are sectional views showing a configuration of a stencil mask according to a sixth embodiment of the present invention.
Figure 11B:
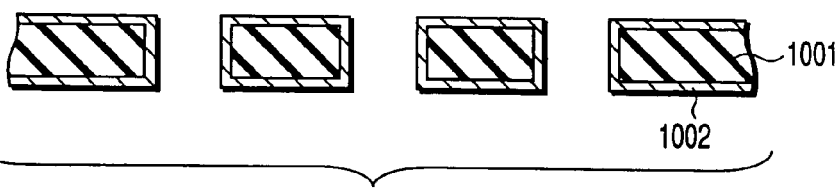
Figure 11C:

FIGS. 11A to 11C are sectional views showing a configuration of a stencil mask according to a sixth embodiment of the present invention. In FIGS. 11A to 11C, the identical reference numerals are attached to the identical sites with those of FIGS. 9A and 9B, and its description is omitted.

In the present embodiment, as shown in FIG. 11A, a surface of a silicon nitride film 1001 is covered with a tungsten 1002. Since the tungsten 1002 has a higher electrical conductivity, it can prevent a stencil mask from electrification by the shielded ion charge at the time when the ion implantation is performed. Moreover, similarly to the fifth embodiment, the tungsten 1002 of the surface can be selectively removed from the silicon nitride film 1001 (FIG. 11B). Moreover, the silicon nitride film 1001 can be also selectively removed from a silicon thin film 103 which exists inside (FIG. 11C). After removing the coated film, a stencil mask can be also reproduced similarly to the fifth embodiment.

According to the present embodiment, since a silicon nitride film which is harder than silicon is formed on the surface of the silicon thin film, it is not easily deformed. Moreover, it can be reproduced by selectively removing the silicon nitride film into which the damages are introduced at the time of performing ion implantation process and again covering on the surface of the silicon thin film. Moreover, a stencil mask can be prevented from being electrified by covering the metal film on the outermost surface.

Now, although the combination of the covering film and the mask material which exists inside is not limited to this, it is desired for the purpose of preventing the accumulation of electric charge that one of them has a higher electric conductivity comparing to the other.

Seventh Embodiment

Figure 12:
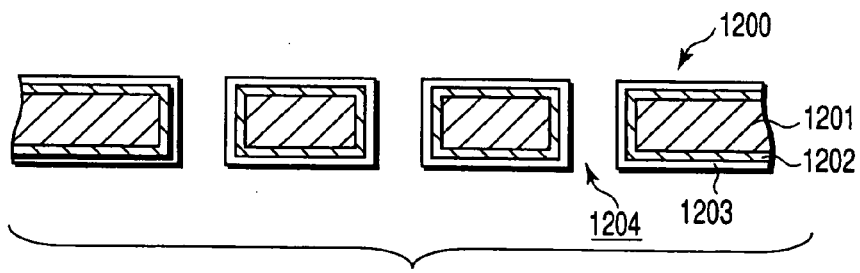
FIG. 12 is a sectional view showing a configuration of a stencil mask according to a seventh embodiment of the present invention.

FIG. 12 is a sectional view showing a configuration of a stencil mask according to a seventh embodiment of the present invention.

As shown in FIG. 12, a surface of a tungsten thin film 1201 having a thickness of the order of 5 to 20 μm on which the pattern for ion implantation is formed is covered by a nitride titanium 1202 and a silicon layer 1203.

The tungsten thin film can be processed using the known technologies using photolithography technology and anisotropy etching similarly to the processing of the silicon thin film of the above embodiment. Moreover, the nitride titanium 1202 and the silicon layer 1203 can be formed using the known technologies such as a CVD method and the like. The nitride titanium 1202 prevents the reaction between the tungsten thin film 1201 and the silicon layer 1203.

Figure 13:
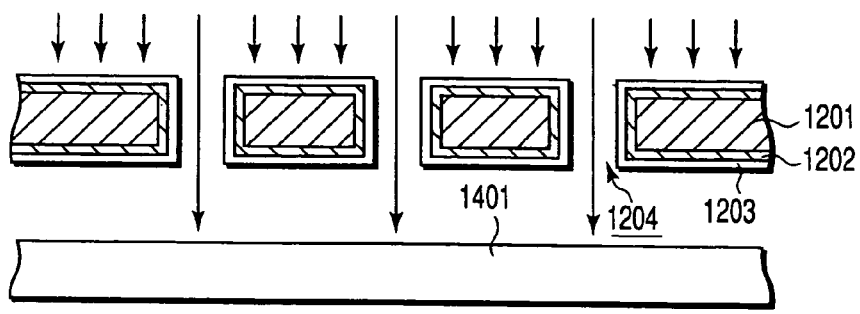
FIG. 13 is a sectional view showing an example in which the stencil mask of the seventh embodiment of the present invention is used in an ion implantation process.

A stencil mask 1200 whose core is the tungsten thin film 1201 is enhanced than one whose core is silicon in the viewpoint of the strength against the deformation. As shown in FIG. 13, in the case where the stencil mask 1200 is used in the ion implantation process applied to a semiconductor substrate 1401, the tungsten thin film 1201 can be prevented from being spattered with the ion accelerated by the silicon film 1203 covering the surface of the tungsten thin film 1201, and the semiconductor substrate 1401 can be prevented from being polluted by the tungsten.

Moreover, since the electric conductivity of the tungsten thin film 1201 which exists inside, a stencil mask can be prevented from being electrified by the charge of the shielded ion at the time of performing the ion implantation as well as the strength of the mask can be enhanced in the structure of the present embodiment at the same time.

In the case of the present embodiment, after a stencil mask is used in the ion implantation process several times, the silicon layer is selectively removing by etching using fluorine radical and the like, a silicon layer is newly formed by a CVD method, and it may be prepared for the next ion implantation. The selective removal of Si film becomes easy by forming a nitride titanium film between the tungsten thin film and the silicon layer. Except for nitride titanium, Si oxide film, Si nitride film, SiC film and the like may be available.

In order to make the thermal conductivity and the flow of charge better, after an n-type or a p-type impurity is added, a Si film may be heated.

In the case where a stencil mask whose thickness is thinner than 5 to 20 μm is processed, except for tungsten, the materials such as SiC, W, Mo and the like whose Young' modulus are higher than that of Si may be used. The nitride titanium film is not necessarily required and a silicon layer may be formed directly on the tungsten thin film.

Eighth Embodiment

Figure 14:
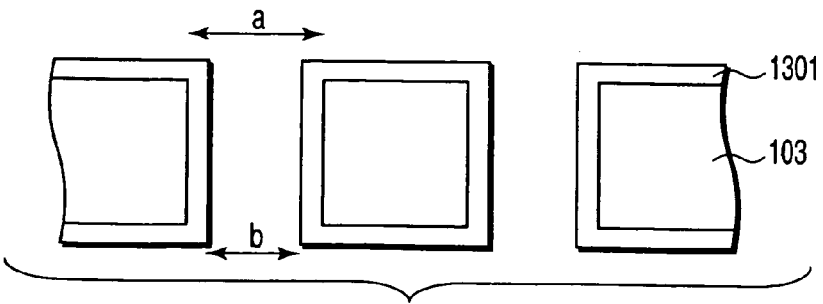
FIG. 14 is a sectional view showing a configuration of a stencil mask according to an eighth embodiment of the present invention.

Next, an example in which the refining of the opening is performed by covering the outermost layer while controlling the thickness is shown in FIG. 14. Now, a polysilicon 1301 is formed via a silicon oxide film, a silicon nitride film, a SiC film and the like on a surface of a silicon thin film 103. An opening size a of an opening of the silicon nitride film 103 is a processing size which is realized by a photo-lithography technology and an anisotropy etching technology. Furthermore, an opening size b which is refined and smaller than the size initially opened can be realized by controlling a film thickness of the polysilicon 1301 and by forming the film. In the present embodiment, although an example in which silicon is covered with polysilicon is shown, the material is not limited to this.

Ninth Embodiment

In the present embodiment, a reproducible stencil mask will be described below similarly to the fifth to seventh embodiments.

A method for manufacturing a stencil mask according to a ninth embodiment of the present invention and a method for manufacturing a semi-conductor device using the stencil mask will be described below with reference to FIGS. 15A to 15G.

Figure 15A:
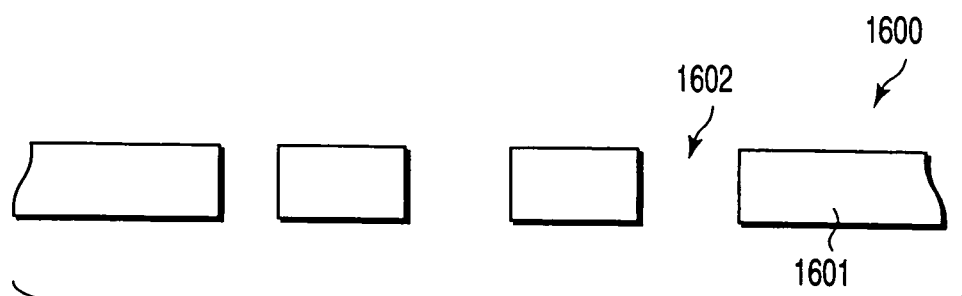

First, as shown in FIG. 15A, a stencil mask 1600 comprising a shielding film 1601 made of a silicon film on which an opening 1602 through which an ion beam passes is formed is prepared. The shielding film is configured with a silicon thin film.

Figure 15B:
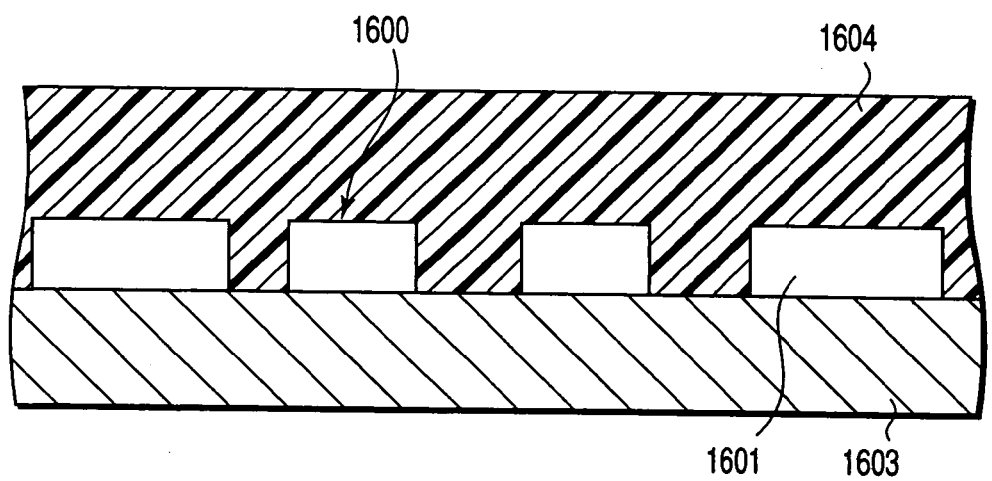

Subsequently, as shown in FIG. 15B, the ion irradiation surface of the stencil mask 1600, which is previously made faced upward, is fixed on a base 1603 such as an electrostatic chuck or a vacuum chuck and the like. A first resist 1604 is coated and formed on the entire surface of the ion irradiation surface of the stencil mask 1600. At this time, the first resist 1604 is also embedded into the opening 1602. Although it is considered that the first resist 1604 may get into the gap between the base 1603 and the stencil mask 1600, there is no problem even if it turns to be in such a state. Then, the processing such as a baking or the like is performed similarly to the conventional method for manufacturing a semi-conductor device.

Figure 15C:
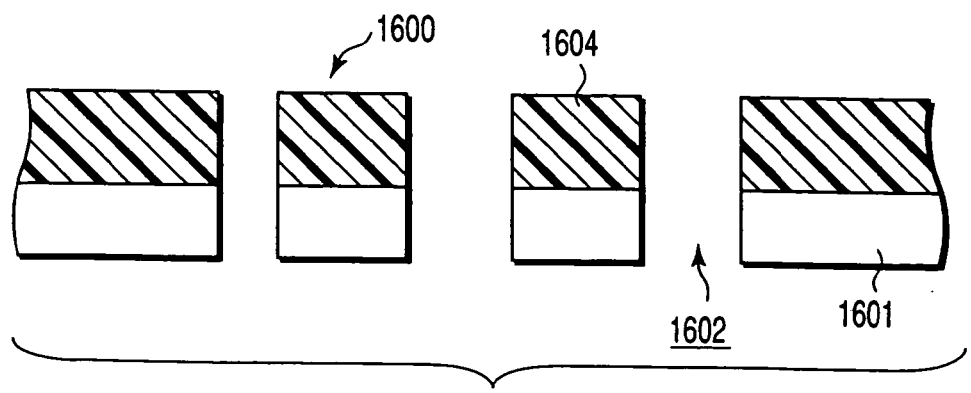

Subsequently, as shown in FIG. 15C, after the stencil mask 1600 is removed from the base 1603, a light or an electron beam is irradiated from the ion-non-irradiated surface side and the exposure of the first resist 1604 is performed. Then, the development of the first resist 1604 is performed, and an opening is formed on the first resist 1604.

Since in this exposure, the stencil mask 1600 comprising a shielding film 1601 becomes a mask for exposure, the first resist 1604 which is located in the opening 1602 and on the upper face of the opening 1602 is removed. If the opening 1602 performs the exposure with a light in the refined pattern such as 0.1 micron, it means to be exposed in the area nearby the light wavelength, and it is possible that the pattern collapse occurs due to the light wave characteristic. Hence, it is more desirable that the light exposure is done by an electron beam having sufficiently a short wavelength with respect to the opening 1602. Moreover, in the case where the first resist 1604 within the opening 1602 is not entirely removed by performing the exposure once, exposures and developments may be repeated plural times.

The first resist 1604 within the opening 1602 is capable of being removed without the exposure technology. The first resist 1604 within the opening 1602 is removed by performing RIE using oxygen plasma from the back surface similarly to the above-described exposure. The etching mask in this RIE is the shielding film 1601 made of silicon constituting the stencil mask 1600, however, since silicon is little etched by oxygen plasma and it damages the shielding film 1601 scarcely at all, there is no problem.

Subsequently, as shown in FIG. 15D, an ion beam 1605 is irradiated to a semiconductor substrate 1606 via the stencil mask 1600 where the first resist 1064 is formed on the ion beam irradiation surface, and the ion beam is selectively irradiated to the semiconductor substrate 1606. Ions implanted as impurities are accumulated on the first resist 1604 by irradiating the ion beam 1605. Using this stencil mask, the ion beam irradiations are performed once or more.

Subsequently, after ions were accumulated on the first resist 1604, as shown in FIG. 15E, the first resist 1604 covering the upper surface of the stencil mask 1600 is incinerated by oxygen plasma and the like and selectively removed. Damages due to the ion implantation process and impurities implanted can be removed by selectively removing the first resist 1604.

Subsequently, as shown in FIG. 15F, a second resist 1607 is formed on the ion irradiation surface of the stencil mask 1600 using the process previously described above.

Then, as shown in FIG. 15G, an ion implantation is performed using the stencil mask 1600 on which the second resist 1607 is formed.

Although the formations and removals of the resist to the stencil mask are performed two times in the above-described description, these are not limited to two times, the formation and removals of the resist can be performed any given times.

If the method for manufacturing a semiconductor device described above is used, the ion implantation process can be performed without distortion of the stencil mask any given times.

As described above, a group of devices performing a process of forming a stencil mask, that is, a resist coating device, a device for exposing the back surface or a device for performing a RIE to the back surface using oxygen plasma and a developing device are stored within the stencil mask ion implantation device, and further, a device for peeling a resist, concretely, a resist incinerating device using oxygen plasma and a chemical processing device for resolving a resist are also stored within the stencil mask ion implantation device. In this way, when a stencil ion implantation is performed, two or more sheets of stencil masks are prepared, at the time when one of the sheets is performing the stencil ion implantation, the other stencil mask is performing peeling of the deteriorated resist by ion implantation of the impurities and a resist film is formed again by the above-described method. Then, when the resist is deteriorated by the ion implantation of the impurities, the ion implantation is performed using the other stencil mask prepared in advance. Owing to this, the stencil ion implantation process is capable of being performed without stopping.

Tenth Embodiment

Conventionally, a stencil mask is formed using a SOI substrate. The SOI substrate is more expensive than a silicon wafer in bulk. As a result, the manufacturing cost of a stencil mask has been raised. In the present embodiment, a method for manufacturing a stencil mask capable of lowering the manufacturing cost thereof by forming a stencil mask using a silicon wafer in bulk will be described below.

A method for manufacturing a stencil mask according to a tenth embodiment of the present invention will be described below using the sectional views illustrating the process shown in FIGS. 16A to 16F.

Figure 16A:
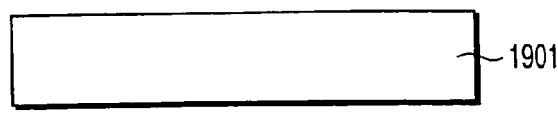
FIGS. 16A to 16F are sectional views illustrating a manufacturing process of a stencil mask according to a tenth embodiment of the present invention.
Figure 16B:
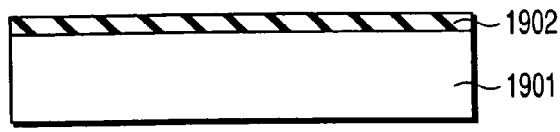

As shown in FIG. 16A, a silicon substrate 1901 to be a supporting portion of a stencil mask is prepared. Subsequently, as shown in FIG. 16B, a $SiO_2$ film 1902 is formed, which is to be a stopper at the time when the pattern processing of an opening of the stencil mask is performed later and at the time when the supporting portion of the bask surface is opened later.

Figure 16C:
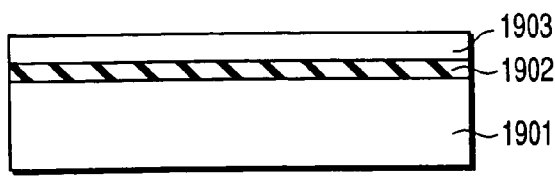
Figure 16D:
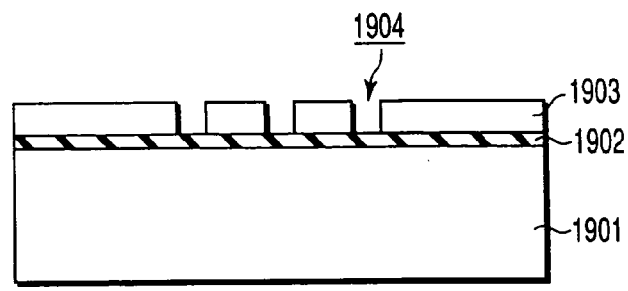

Subsequently, as shown in FIG. 16C, an amorphous silicon 1903 is deposited as a thin film portion material in a desired thickness on the $SiO_2$ film 1902. Subsequently, as shown in FIG. 16D, the opening 1904 to which the $SiO_2$ film 1902 is exposed is formed on the amorphous silicon 1903. Later, an ion beam passes through the opening 1904.

Figure 16E:
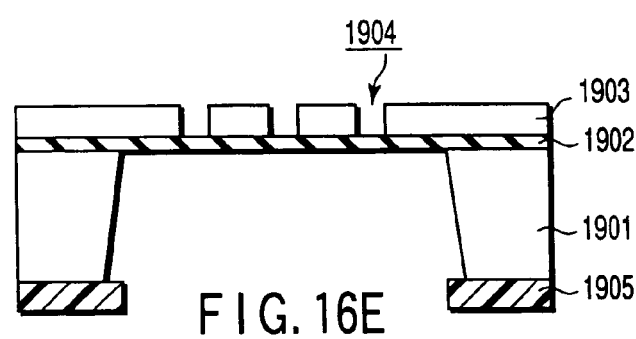
Figure 16F:
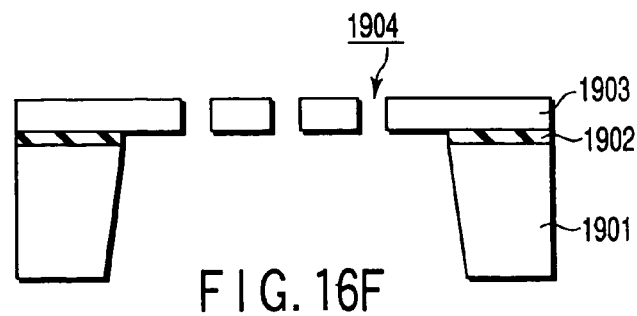

Subsequently, as shown in FIG. 16E, after a mask 1905 is formed on the back surface of the silicon substrate 1901, the silicon substrate 1901 is etched and the $SiO_2$ film 1902 is exposed. Subsequently, as shown in FIG. 16F, after a mask 1905 is removed, the $SiO_2$ film to be exposed is etched.

As for the stencil mask thus prepared, the stencil mask can be manufactured in a cheaper cost than a stencil mask manufactured using a SOI substrate. Herein, the present embodiment has been described using the combination of the silicon substrate 1901, the $SiO_2$ film 1902 and the amorphous silicon 1903 as a substrate to be a supporting portion, a stopper film, and a thin film portion material, however, the combination is not limited to this. Any combination may be available in which the selectivity involving with the mask exists and the pattern formation ability of the thin film portion is secured in the process of opening the pattern (FIG. 16D) and the process of etching the back surface (FIGS. 16E and 16F).

Eleventh Embodiment

By enhancing the strength of a stencil mask, the durability can be enhanced and the life can be enhanced. There is a method of thickening the film thickness for the purpose of enhancing the strength of a stencil mask. However, since conventionally a stencil mask is made using a SOI substrate, the film thickness is limited to a single film thickness. On the other hand, the precision of the fine processing of a stencil mask depends on the material of the film to be processed and the film thickness, and in general, what is called an aspect ratio, that is, the ratio of the opening size and the depth direction. Therefore, for a stencil mask using a SOI substrate made of a silicon single crystalline, from the request of the fine processing, the thickness is limited, and the mask strength is insufficient.

Therefore, in the present embodiment, a method for manufacturing a stencil mask capable of realizing both fine processing and enhancement of strength by changing the film thickness of the surrounding silicon film corresponding to the size of the opening through which an ion beam passes will be described below. The phrase "changing the film thickness of the surrounding silicon film corresponding to the largeness of the opening" could be said in other words by the phrase "the changing the depth of the opening".

FIGS. 17A to 17F are sectional views illustrating a manufacturing process of a stencil mask according to an eleventh embodiment of the present invention.

Figure 17A:
FIGS. 17A to 17F are sectional views illustrating a manufacturing process of a stencil mask according to an eleventh embodiment of the present invention.
Figure 17B:
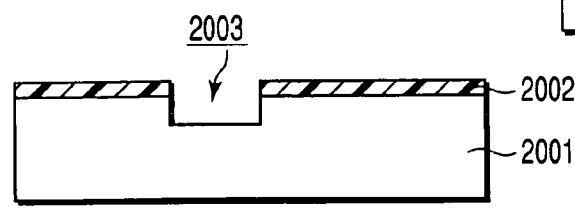

First, as shown in FIG. 17A, a silicon substrate 2001 in bulk is prepared. A resist 2002 having an opening in the region in which the film thickness is desired to thicken among the thin film portion of the stencil mask is formed on the silicon substrate 2001. Subsequently, as shown in FIG. 17B, the silicon substrate 2001 is selectively etched using the resist 2002 as a mask and a concave portion 2003 is formed on the silicon substrate 2001. Any of methods of an isotropy etching, a chemical processing and a CDE method corresponding to the width of the boundary between the region in which the film thickness is thickened and the region in which the film thickness is relatively thinner may be used. The depth of etching performed at this time is the difference of film thickness of the shielding film.

Figure 17C:
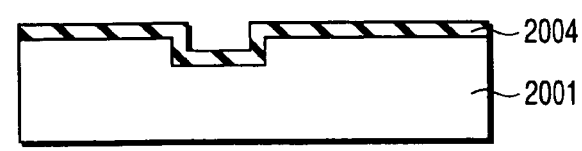
Figure 17D:
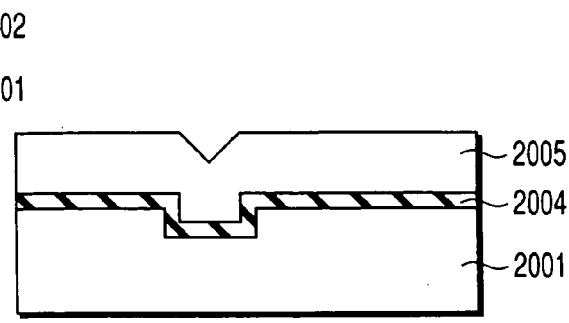

Subsequently, as shown in FIG. 17C, after the resist 2002 is removed, a stopper film 2004 such as a silicon oxide film and the like are formed on the silicon substrate. Subsequently, as shown in FIG. 17D, a thin film portion material 2005 is formed as a film on the stopper film 2004.

Figure 17E:
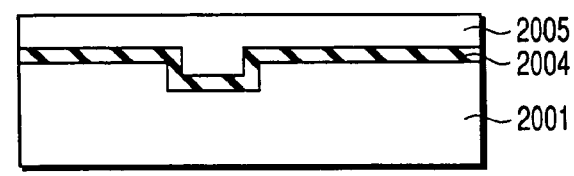

Subsequently, to as shown in FIG. 17E, using a flattening technology such as a CMP and the like, the thickness of the thin film portion material 2005 is made to be a desired thickness as well as the surface of the thin film portion material 2005 is flattened. The CMP process may be stably performed by previously melting the surface with a heat processing in a high temperature before performing the CMP and enhancing the flatness of the surface.

Figure 17F:
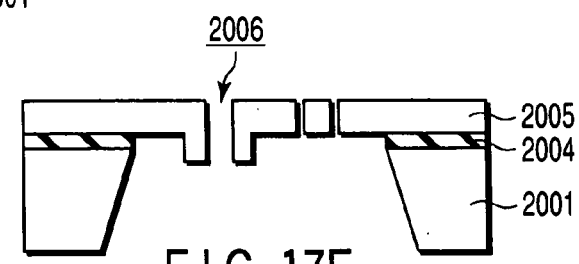

Subsequently, as shown in FIG. 17F, a patterning process and a thinning film by etching the back surface are performed similarly to the conventional mask. By the process described above up to this point, a stencil mask having openings of different depths corresponding to the size of the openings can be manufactured.

As described above, a stencil mask in which both processing precision of the fine processing and strength of the mask are realized by making the depth be shallower in the case of the smaller opening to which the fine processing is required, and making the depth be deeper in the case of the other region to which the fine processing is not required. Since it is formed of a silicon substrate in bulk, the manufacturing cost of a stencil mask can be lowered.

Figure 18:
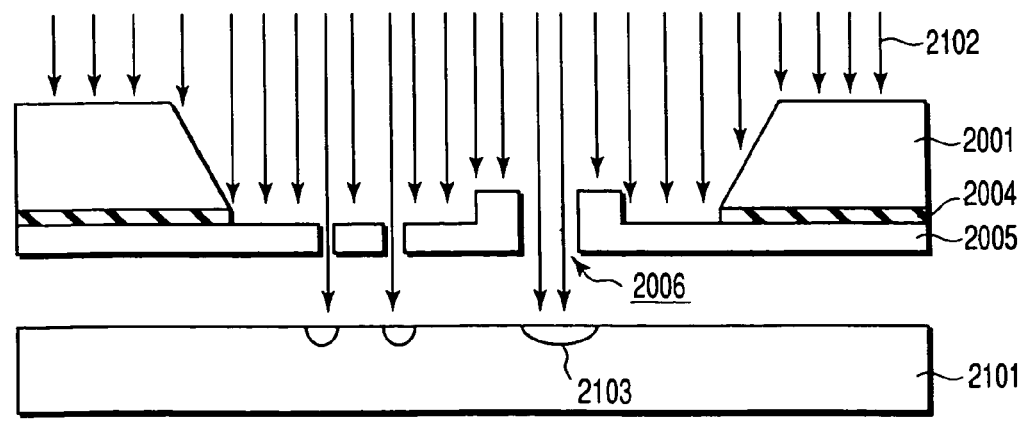
FIG. 18 is a view showing a manufacturing process of a semiconductor device using a stencil mask of the eleventh embodiment of the present invention.

A manufacturing process of a semiconductor device using this stencil mask is shown in FIG. 18. As shown in FIG. 18, by irradiating an ion beam 2102 to a semiconductor substrate 2101 via a stencil mask, an ion implantation region 2103 can be formed in the lower portion of an opening 2006.

As described above, the durability of the stencil mask is high and the manufacturing cost is low. Therefore, the manufacturing cost of a semiconductor device can be lowered by applying a stencil mask to a manufacturing for a semiconductor device.

Twelfth Embodiment

A method for manufacturing a stencil mask in which depth of an opening is different corresponding to the largeness will be described with reference to FIGS. 19A to 19F. FIGS. 19A to 19F are sectional views illustrating a manufacturing process of a stencil mask according to a twelfth embodiment of the present invention.

Figure 19A:
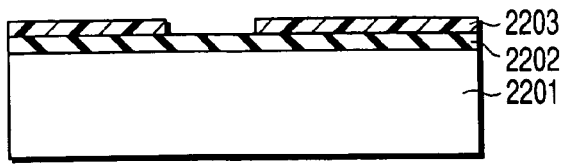
FIGS. 19A to 19F are sectional views illustrating a manufacturing process of a stencil mask according to a twelfth embodiment of the present invention.

First, as shown in FIG. 19A, a silicon oxide film 2202 is formed on a silicon substrate 2201 to be a substrate. Next, a resist 2203 having an opening in the desired region in which the film thickness is thickened among the thin film portion of the stencil mask is formed on the silicon oxide film 2202. Subsequently, as shown in FIG. 19B, the silicon oxide film 2202 is selectively etched by making a resist 2203 as a mask, and an opening 2204 to which the silicon substrate 2201 is exposed is formed. Then, the resist 2203 is selectively removed.

Figure 19D:
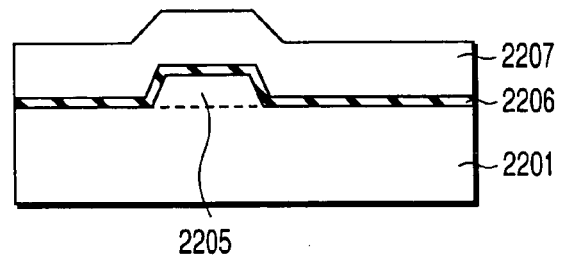
Figure 19B:
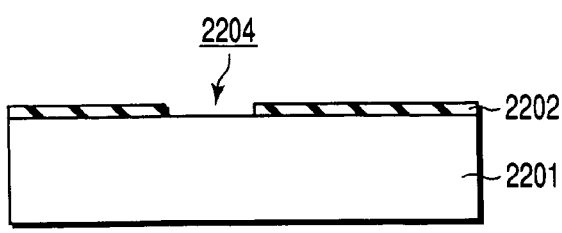
Figure 19E:
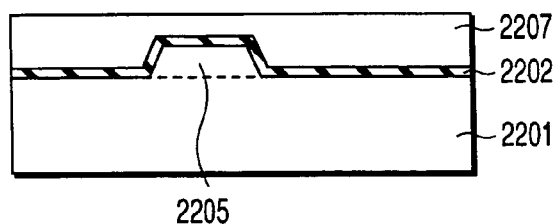
Figure 19C:
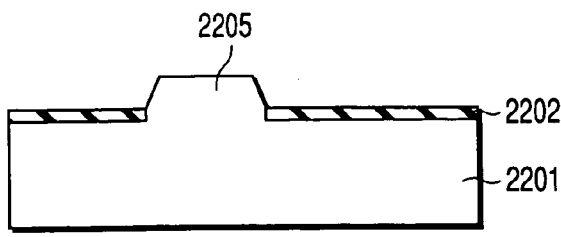

Subsequently, as shown in FIG. 19C, a single crystal silicon film 2205 is selectively epitaxially grown on the surface of the silicon substrate 2201 exposed to the opening 2204. The film thickness of the single crystal silicon film 2205 is the difference of the film thickness. Therefore, the single crystal silicon film 2205 is grown until the necessary film thickness (film thickness difference) is obtained.

Subsequently, as shown in FIG. 19D, after the silicon oxide film 2202 is selectively removed, a stopper film 2206 is formed on the surface of the silicon substrate 2201 and the single crystal silicon film 2205. Before the stopper film 2206 is formed, the silicon oxide film 2202 might not be removed. Next, a thin film portion material 2207 is formed on the stopper film 2206 such as the silicon oxide film and the like.

Subsequently, as shown in FIG. 19E, the thickness of the thin film portion material 2207 is made into a desired thickness as well as the surface of the thin film portion material 2207 is flattened using flattering technologies such as a CMP and the like.

Figure 19F:
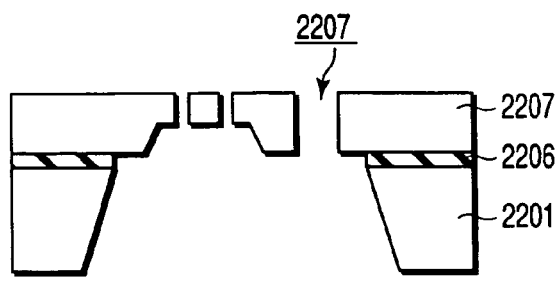

Subsequently, as shown in FIG. 19F, when a pattern processing similar to the conventional stencil mask and a thinning by etching on the back surface are performed, the film thickness of the thin film portion material 2207 has a plurality of film thicknesses, a stencil mask in which depth of the opening is different corresponding to the size can be manufactured.

As described above, a stencil mask in which both processing precision of the fine processing and strength of the mask are realized by making the depth be shallower in the case of the smaller opening to which the fine processing is required, and making the depth be deeper in the case of the other region to which the fine processing is not required. Since it is formed of a silicon wafer in bulk, the manufacturing cost of a stencil mask can be lowered.

Similarly to the eleventh embodiment, the manufacturing cost of a semiconductor device can be lowered by applying a stencil mask to the manufacturing for a semiconductor.

Thirteenth Embodiment

A method for manufacturing a stencil mask in which depth of an opening is different corresponding to the largeness will be described with respect to FIGS. 20A to 20E. FIGS. 20A to 20E are sectional views illustrating a method of a manufacturing process of a stencil mask according to a twelfth embodiment of the present invention.

Figure 20A:
FIGS. 20A to 20E are sectional views illustrating a manufacturing process of a stencil mask according to a thirteenth embodiment of the present invention.

First, as shown in FIG. 20A, a single crystalline silicon substrate 2301 in bulk as a substrate material for manufacturing a stencil mask is prepared. Subsequently, as shown in FIG. 20B, a mask 2302 is formed in the desired region to be relatively thinned among the thin film portion of the silicon substrate 2301. The mask 2302 can be formed by selectively epitaxially growing a silicon thin film, for example, using a resist film as a mask. This mask 2302 is formed in order to reduce the rate of oxygen ion at the time of oxygen ion implantation later.

Figure 20D:
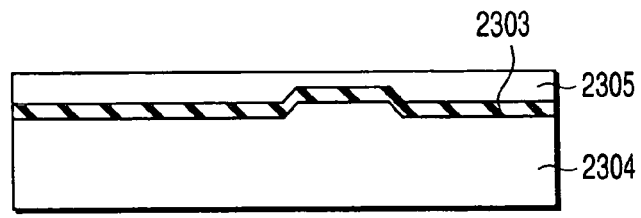
Figure 20B:
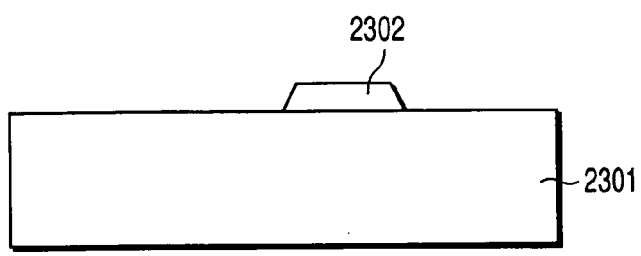
Figure 20E:
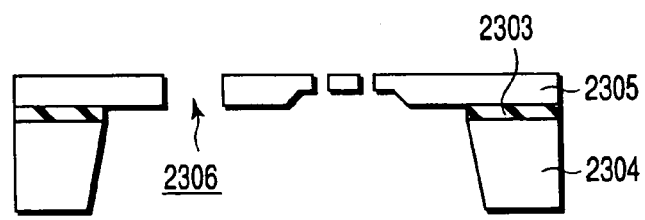
Figure 20C:
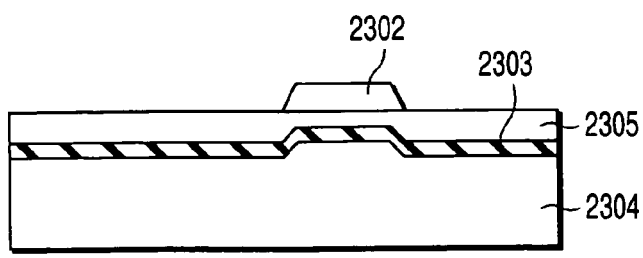

Subsequently, as shown in FIG. 20C, in a state where a mask 2302 is formed, oxygen ions are uniformly implanted into the in-plane at the desired energy, an etching stopper 2303 is formed, and the silicon substrate 2301 is divided into a silicon thin film portion 2305 and a supporting substrate portion 2304. The etching stopper 2303 of the formation region of the mask 2302 is formed in a shallower shape that the region in which the mask is not formed, and the film thickness of the silicon thin film portion 2305 is thinner that the other regions.

Subsequently, as shown in FIG. 20D, the mask 2302 formed on the surface of silicon thin film portion 2305 is removed by the CMP method and the like.

Subsequently, as shown in FIG. 20E, according to a process similar to the conventional one, after an opening 2306 to which the etching stopper 2303 is exposed is formed on the predetermined region of the silicon thin film portion, the supporting substrate portion 2304 and the etching stopper 2303 which are unnecessary regions are removed, and a stencil mask is formed.

According to the process described above, a stencil mask in which the thickness of the silicon thin film portion 2305 is varied and depth of the opening 2306 is different corresponding to the largeness can be manufactured. A stencil mask is capable of being manufactured while the strength of the entire mask is maintained by thinning the film thickness in the region where the refined processing is required. Moreover, since it is formed from the silicon substrate 2301 in bulk, the manufacturing cost of a stencil mask can be lowered.

Similarly to the eleventh embodiment, the manufacturing cost of a semiconductor device can be lowered by applying a stencil mask to the manufacturing process of a semiconductor device.

According to the necessity, after the oxygen ion implantation is performed, the defect made in the film may be recovered by performing the heating processing. Moreover, after an ion implantation or after an ion implantation and a heat processing, the film thickness of the silicon thin film portion 2305 may be increased by the procedures such as epitaxial growth method and the like.

Fourteenth Embodiment

If electric charge of ions shielded with a stencil mask is accumulated on a stencil mask in an ion implantation process, there is a problem that a discharging phenomenon between a non-processing substrate and the stencil mask occurs or the stencil mask is moved toward the non-processed substrate by electrostatic force and the stencil mask is deformed. If the deformed stencil mask is used, since the pattern formation ability is lowered, non-defective ratio of the manufactured semiconductor device is lowered, and as a result, the manufacturing cost of the semiconductor device is raised.

At the time of ion implantation, since the ion implantation is performed in a state of the thin film side is made faced downward, and the gap between the thin film and the semiconductor substrate is on the order of 100 μm, it is difficult to ground the thin film and discharge the electric charge.

In the present embodiment, a stencil mask capable of efficiently discharging the electric charge from the stencil mask will be described below.

FIGS. 21A to 21E are sectional views illustrating a manufacturing process of a stencil mask according to a fourteenth embodiment of the present invention.

Figure 21A:
FIGS. 21A to 21E are sectional views illustrating a manufacturing process of a stencil mask according to a fourteenth embodiment of the present invention.

First, as shown in FIG. 21A, a silicon substrate 2401 in bulk is prepared. Subsequently, as shown in FIG. 21B, a shielding member 2402 is installed in the region for shielding implantation ion of the silicon substrate 2401. At this time, the shielding member 2402 is installed so that implantation ions are necessarily formed in the region where the film thin portion of the stencil mask is formed. As for the region where ions are implanted, it is desirable that an ion implantation is performed in a region of the order of 100 μm to 10 mm wider as one side than the region opened by the back side surface etching in order to have a process margin of the back side surface etching. As a shielding member, it may be a thick resist mask formed using a lithography technology, or a glass mask, a silicon mask and the like in which the desired region is opened have been previously made, and this may be utilized.

Figure 21D:
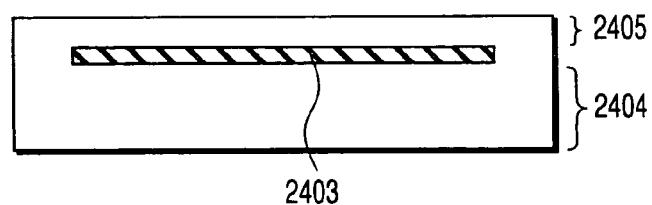
Figure 21B:
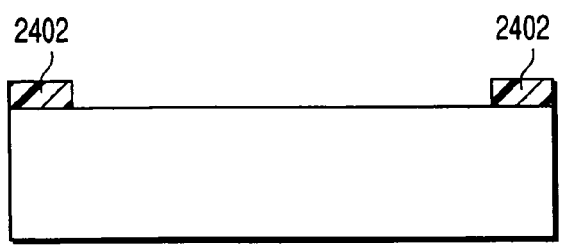
Figure 21E:
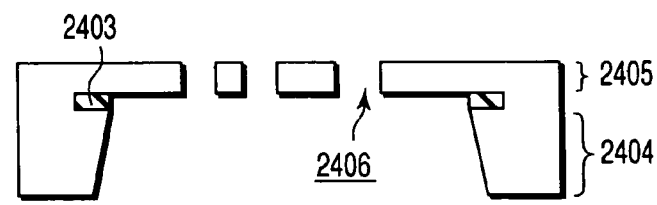
Figure 21C:
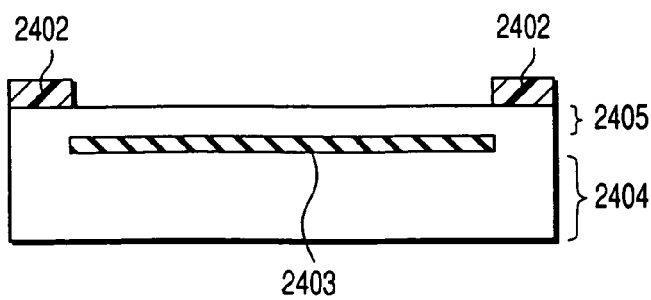

Subsequently, as shown in FIG. 21C, an oxide film 2403 to be an etching stopper is formed by implanting an oxygen ion into the silicon substrate 2401, and the silicon substrate 2401 is divided into a silicon thin film portion 2405 and a supporting substrate portion 2304. Since oxygen ions are not implanted into the silicon substrate 2401 below the shielding member 2402, the silicon thin film portion 2405 and the supporting substrate portion 2404 are electrically conductive to each other.

Subsequently, as shown in FIG. 21D, the shielding member 2402 is removed from the surface of the silicon thin film portion 2405. Subsequently, as shown in FIG. 21E, after an opening 2406 is formed similarly to the conventional stencil mask, the thinning is performed by the back side surface etching.

As described above, a stencil mask having a higher electric conductivity between the silicon thin film portion 2405 and the supporting substrate portion 2404 of the stencil mask can be manufactured. Moreover, according to the necessity, after an ion implantation is performed, the defect made in the film may be recovered by performing the heat processing. Moreover, after an ion implantation is performed or after an ion implantation and a heat processing are performed, the film thickness of the silicon thin film portion 2405 may be increased using the procedure such as an epitaxial growth and the like.

Figure 22:
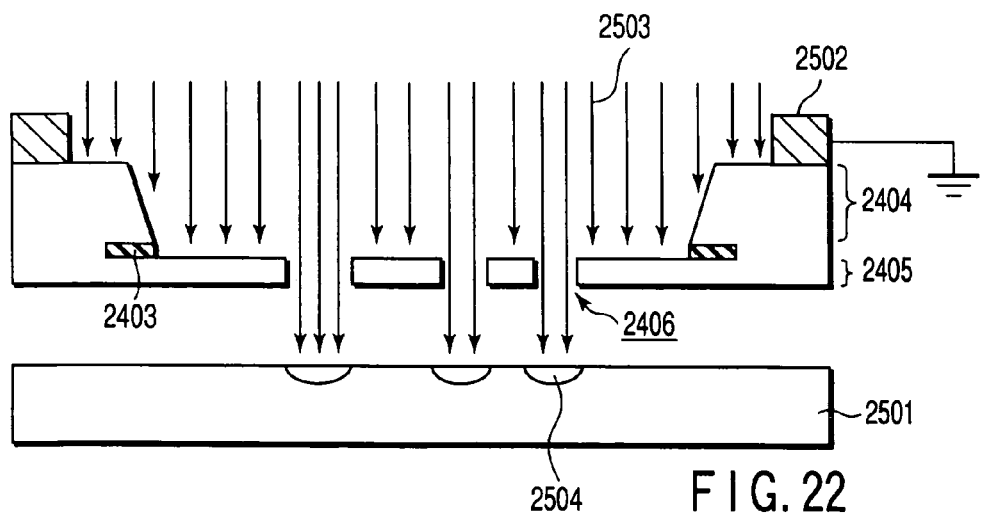
FIG. 22 is a view showing a manufacturing process of a semiconductor device using a stencil mask of the fourteenth embodiment of the present invention.

A manufacturing process of a semiconductor device using the stencil mask is shown in FIG. 22. As shown in FIG. 22, on a semiconductor substrate 2501, a stencil mask 2400 fixed by an electrostatic chuck device 2502 in a ring shape is arranged. The electrostatic chuck device 2502 is grounded and the supporting substrate portion 2404 and the electrostatic chuck device 2502 are electrically conductive to each other.

An ion implantation region 2504 is formed below the opening 2406 by irradiating an ion beam 2503 to the semiconductor substrate 2501 via the stencil mask 2400. At this time, since the silicon thin film portion 2405 of the stencil mask 2400, the supporting substrate portion 2404 and the electrostatic chuck device are electrically connected to each other, and the electrostatic chuck device 2502 is grounded, the electric charges of the stencil mask 2400 can be efficiently discharged. As a result, the lowering of the pattern formation ability can be suppressed due to the deformation of the silicon thin film portion 2405 of the stencil mask 2400. As a result, the non-defective ratio of the manufactured semiconductor device can be prevented, and the manufacturing cost of the semiconductor device can be suppressed.

Fifteenth Embodiment

In the present embodiment, a method for manufacturing a stencil mask which enhanced the electric conductivity and heat conductivity between a supporting portion and a thin film portion will be described below with reference to FIGS. 23A to 23G. FIGS. 23A to 23G are sectional views illustrating a manufacturing process of a stencil mask according to a fifteenth embodiment of the present invention.

Figure 23A:
FIGS. 23A to 23G are sectional views illustrating a manufacturing process of a stencil mask according to a fifteenth embodiment of the present invention.

First, as shown in FIG. 23A, a silicon substrate 2601 in bulk is prepared. Next, a silicon oxide film 2602 is formed on a silicon substrate 2601. Subsequently, as shown in FIG. 23C, a resist 2603 is formed in a region except for the region concealed with the supporting portion after the manufacturing of the stencil mask. Subsequently, the silicon oxide film 2602 is selectively removed by making the resist 2603 as a mask. For the removal of the silicon oxide film 2602, in general, it is considered that oxide film is removed by hydrofluoric acid (HF) based chemical processing or the oxide film is removed with a gas based one using a CDE method and the like, however, any procedure may be available.

Figure 23E:
Figure 23B:
Figure 23F:
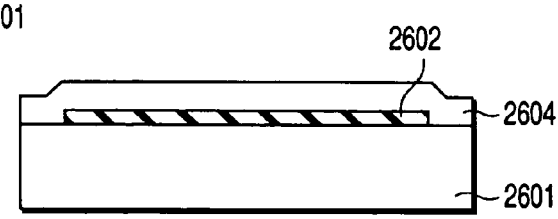
Figure 23C:
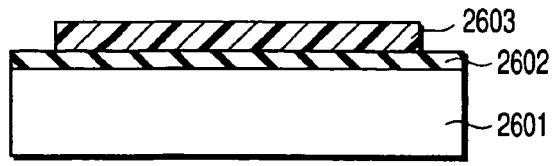
Figure 23G:
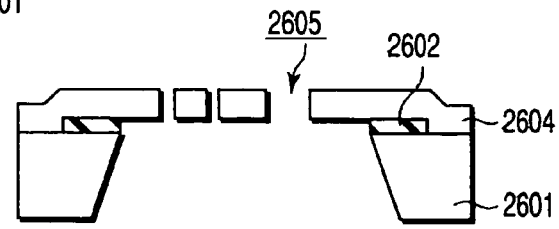
Figure 23D:
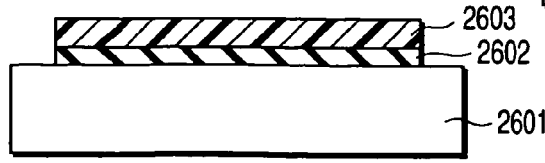

Subsequently, as shown in FIG. 23E, the resist 2603 is selectively removed. Subsequently, as shown in FIG. 23F, a silicon thin film 2604 to be a thin film portion is formed on the silicon substrate 2601 and the silicon oxide film 2602. Subsequently, as shown in FIG. 23G, similarly to the conventional stencil mask, after an opening 2605 is formed on the silicon thin film 2604, the thinning is performed by the back side surface etching.

A stencil mask in which the electric conductivity and heat conductivity between the supporting portion and the thin film portion are high can be manufactured by employing the manufacturing process described above.

Similarly to the fourteenth embodiment, the manufacturing cost of a semiconductor device can be lowered by applying a stencil mask to the manufacturing process of a semiconductor device.

Sixteenth Embodiment

In the present embodiment, a method for manufacturing a mask in which a material of a thin film portion of a stencil mask is made into two layers structure as well as the electric conductivity and the heat conductivity between a supporting portion and a thin film portion are enhanced will be described below with reference to FIGS. 24A to 24F. FIGS. 24A to 24F are sectional views illustrating a manufacturing process of a stencil mask of the sixteenth embodiment of the present invention.

Figure 24A:
FIGS. 24A to 24F are sectional views illustrating a manufacturing process of a stencil mask according to a sixteenth embodiment of the present invention.

First, a silicon oxide film 2702 whose one portion is opened is formed on a silicon substrate 2701 as shown in FIG. 24A via a similar process with a series of process described with reference to FIGS. 23A to 23E in the fifteenth embodiment.

Figure 24B:
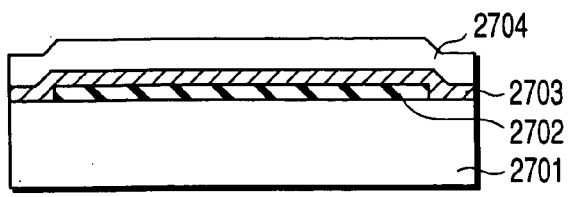
Figure 24C:
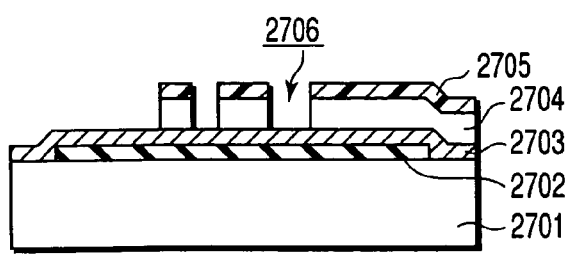

Subsequently, as shown in FIG. 24B, a metal material 2703 and a silicon thin film 2704 are in turn formed on the silicon substrate 2701 and the silicon oxide film 2702. Subsequently, as shown in FIG. 24C, after a resist 2705 having an opening is formed on the silicon thin film 2704, the silicon thin film 2704 is selectively etched by anisotropy etching such as RIE and the like and an opening 2706 to which the metal material 2703 is exposed is formed.

Figure 24D:
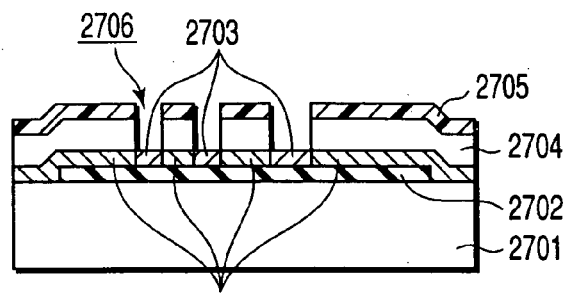

Subsequently, as shown in FIG. 24D, a salicide 2707 is formed by reacting the metal material 2703 and the silicon thin film 2704 by adding the heating processing. At this time, since the metal material 2703 in the region where the opening 2706 is formed does not react with the silicon thin film 2704, it remains as it is.

Figure 24E:
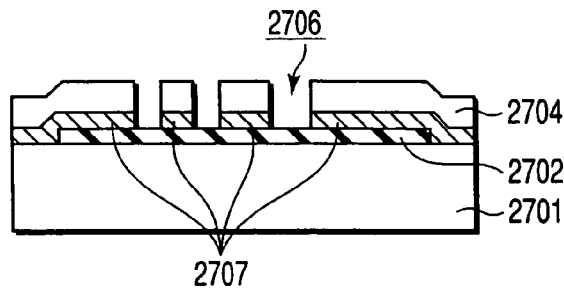

Subsequently, as shown in FIG. 24E, the remaining metal material 2703 is selectively etched. The metal material 2703 in the formation region of the opening 2706, which does not react, can be selectively removed with respect to the salicide 2707 below the silicon thin film 2704 by performing a salicide process.

Moreover, in the case where a salicidization is performed by reacting the metal material 2703 and the silicon thin film 2704, it is desirable that before the silicon thin film 2704 is deposited, an impurity has been previously implanted into the metal film. A stress occurrence accompanying with the volume change at the time of the salicidization reaction can be relaxed by previously having implanted an impurity into the metal.

It is not required that the process of salicidization is necessarily performed, the metal material 2703 which exposes to the opening may be directly removed by employing a chemical resolving metals such as sulfuric acid and the like. However, in this case, the metal film of the shielding portion is laterally backed by the film thickness portion. For example, in the case where the metal material 2703 in the opening 2706 region was removed with 50% margin of the film thickness in a state where the metal material 2703 is 100 nm in a thickness formed as a film, the metal material 2703 remains below the silicon thin film 2704 having a width of 300 nm or more, and below the silicon thin film 2704 having a width of 300 nm or less, the metal material 2703 is in a state of being non-existence.

Figure 24F:
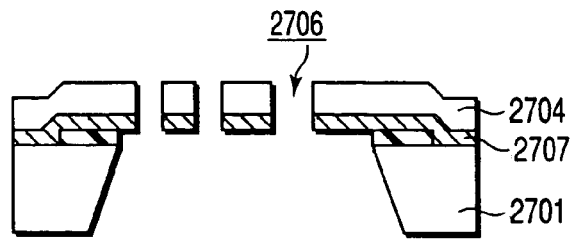

Subsequently, as shown in FIG. 24F, a stencil mask having the salicide 2707 on the surface of the mask can be manufactured by performing the thinning by the back side surface etching similarly to the conventional stencil mask.

In the case where this stencil mask is used for ion implantation, if there would be a problem that the substrate to be processed is polluted by the metal material being sputtered from the surface, it is possible that this problem is solved by forming the film from the material not polluting the substrate to be processed, such as silicon on the metal surface.

This stencil mask has the high electrical conductivity and the heat conductivity by having the metal material. Moreover, by having the metal material, its deflection strength is stronger than the time when the thin film portion is formed by only silicon. Since silicon in the thin film portion where an opening pattern is formed corresponding to the deflection strength enhancement can be further thinned, the processing precision of the refined processing can be enhanced.

Similarly to the fourteenth embodiment, the manufacturing cost of a semiconductor device is capable of being lowered by applying a stencil mask to the manufacturing process of a semiconductor device.

Seventeenth Embodiment

In the present embodiment, a method for manufacturing a stencil mask in which a material of a thin film portion of a stencil mask is made into three-layer structure as well as the electric conductivity and the heat conductivity between a supporting portion and a thin film portion are enhanced will be described below with reference to FIGS. 25A to 25F. FIGS. 25A to 25F are sectional views illustrating a manufacturing process of a stencil mask of the seventeenth embodiment of the present invention.

Figure 25A:
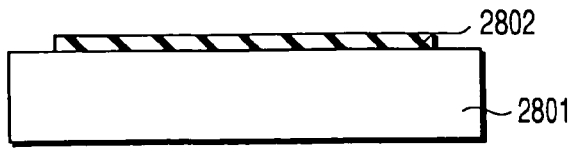
FIGS. 25A to 25F are sectional views illustrating a manufacturing process of a stencil mask according to a seventeenth embodiment of the present invention.

First, a silicon oxide film 2802 is formed on a silicon substrate 2801 as shown in FIG. 25A via a similar process with a series of processes described with reference to FIGS. 23A to 23E in the fifteenth embodiment.

Figure 25B:
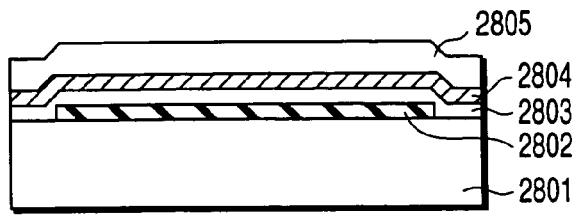

Subsequently, as shown in FIG. 25B, an amorphous silicon film 2803 as a first thin film material, a metal material 2804 as a second thin film material and a silicon thin film 2805 as a third thin film material are in turn formed.

Figure 25C:
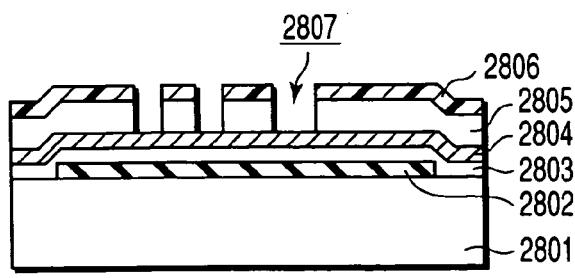

Subsequently, as shown in FIG. 25C, after a resist 2806 having an opening is formed using a lithography technology, the silicon film 2805 is selectively etched by anisotropy etching such as RIE and the like and an opening 2707 to which the metal material 2804 is exposed is formed.

Figure 25D:
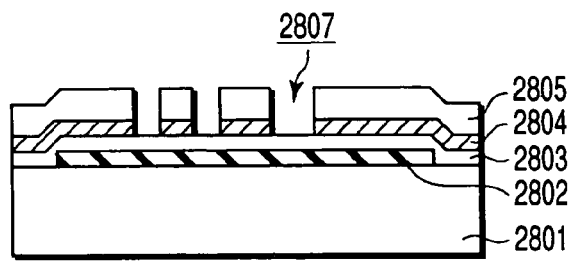
Figure 25E:
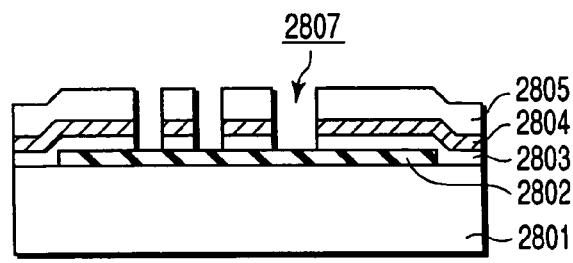

Subsequently, as shown in FIG. 25D, the metal material 2804 exposed to the opening is removed using a chemical resolving a metal such as sulfuric acid and the like. Subsequently, as shown in FIG. 25E, the amorphous silicon film 2803 is selectively removed using an anisotropy etching. At this time, the silicon film 2805 which has been already patterned and formed is similarly going to be etched, therefore, it is desirable that the silicon film 2805 is sufficiently thicker comparing with the amorphous silicon film 2803.

Figure 25F:
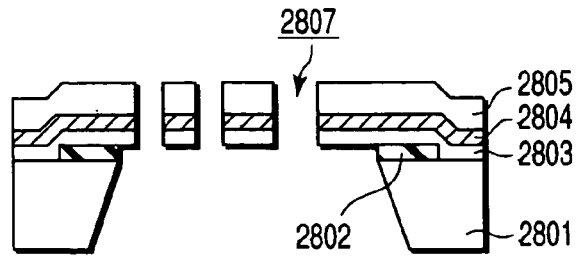

Subsequently, as shown in FIG. 25F, a stencil mask having the silicon film 2805 and also having the metal material 2804 on the surface of the mask can be manufactured by performing the thinning by the back side surface etching similarly to the conventional stencil mask.

The deflection strength of this stencil mask is stronger than the time when the thin film portion is formed with only silicon by having the metal material 2804. Moreover, Since silicon in the thin film portion where an opening pattern is formed corresponding to the deflection strength enhancement can be further thinned, the processing precision of the refined processing can be enhanced.

Similarly to the fourteenth embodiment, the manufacturing cost of a semiconductor device is capable of being lowered by applying a stencil mask to the manufacturing process of a semiconductor. In addition, since as to the stencil mask, the silicon film 2805 is formed on the surface of the mask, when this stencil mask is used, the semiconductor substrate is prevented from metal pollution and this stencil mask has the high electric conductivity and the heat conductivity by having the metal material.

Eighteenth Embodiment

In a manufacturing process of a semiconductor using charged particles such as an ion implantation, there has been a problem that electric charges are accumulated on the wafer and the semiconductor elements are destroyed. A device configuration having a mechanism in which the secondary electron or plasma electron is generated for the purpose of solving this problem, thereby neutralizing the electric charges is generally known. However, for this neutralizing mechanism, its neutralizing amount is varied depending on the state within the device such as the state of a wafer and the state of charged particles or degree of vacuum and the like. Therefore, because of the shortness of the neutralizing amount, or conversely, because of the oversupply of the electron, a negative electrification occurred, and even the case where the semiconductor element has been destroyed has been occurred, and these have been problems. Moreover, there has been a problem that the device was complicated by incorporating such a mechanism into the device.

FIG. 26 is a diagram showing an ion implantation process using a stencil mask according to an eighteen embodiment of the present invention.

As shown in FIG. 26, on a semiconductor substrate 2901 into which charged particles are implanted, a stencil mask 2902 formed with silicon and having an opening 2903 through which an ion beam 2904 passes is disposed. The semiconductor substrate 2901 and the stencil mask 2902 are electrically connected to each other so that a potential difference between them becomes constant. The potential difference between the semiconductor substrate 2901 the stencil mask 2902 is controlled to a given value in a range of from −20 V to +20 V using an electric source 2905 according to the necessity. Out of the range from −20 V to +20 V, the stencil mask and the semiconductor mask and the semiconductor substrate may be contacted with each other by Coulomb's force.

The result of measuring the residual electric charge density of the semiconductor substrate 2901 after the potential difference between the semi-conductor substrate 2901 and the stencil mask 2902 is adjusted to 0 V by the electric source 2905 and the ion implantation is performed into the semiconductor substrate 2901 is shown in FIG. 27. Here, phosphorus ions ($P^+$) are implanted into an oxide silicon film ($SiO_2$) formed on a Si substrate by changing the acceleration energy. In FIG. 27, the term "without mask" refers to the measured results in the case where the ion implantation is performed without controlling the potential difference between the semiconductor substrate 2901 and the stencil mask 2902, and the term "with mask" refers to the measured results in the case where the ion implantation is performed by making the distance between the substrate to be processed and the stencil mask 100 μm and the potential difference is made 0 V. As shown in FIG. 27, it is understood that the residual electric charges remained on the semiconductor substrate 2901 are reduced by controlling the potential difference between the semiconductor substrate 2901 and the stencil mask 2902.

Figure 28:
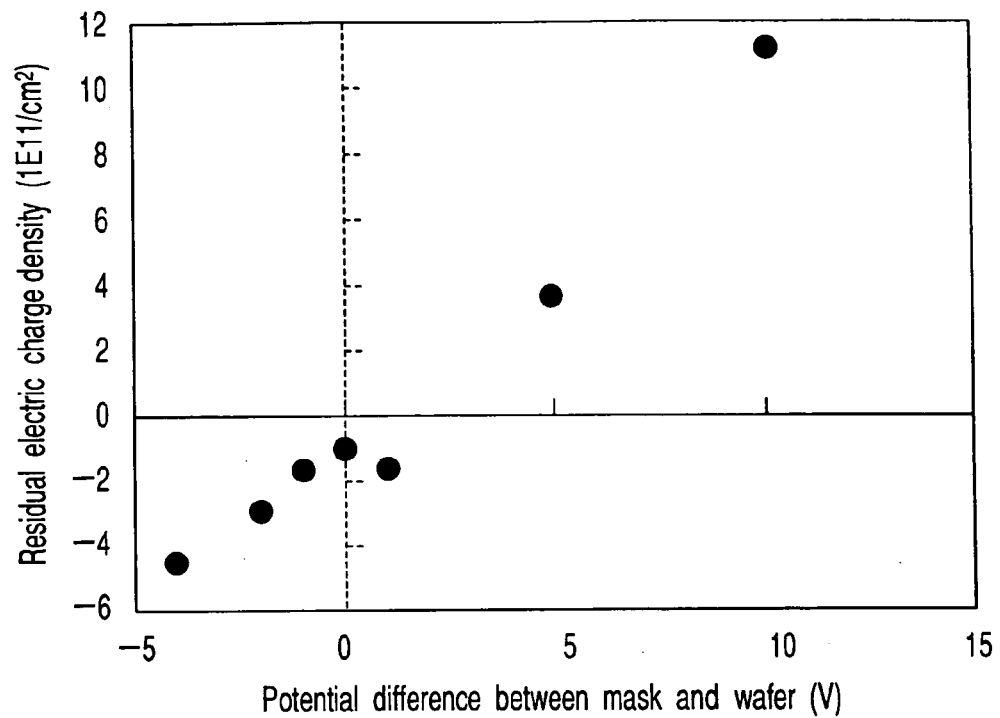
FIG. 28 is a graph showing measurement results of the residual electric charge density of a semiconductor substrate, after an ion implantation is performed by changing a distance between the semiconductor substrate and a stencil mask to be 150 µm and the potential difference to be 4 to 10 V.

Moreover, the results of measuring the residual electric charges by making the distance between the semiconductor substrate 2901 and the stencil mask 2902 be 150 μm, and the potential difference be 0.1 V is shown in FIG. 28. The phosphorous ions (P+) are implanted into the oxide silicon film ($SiO_2$) formed on the Si substrate at the acceleration voltage 50 keV via the stencil mask.

As shown in FIGS. 27 and 28, in the case where the ion implantation is performed at the low acceleration energy on the order of 50 keV, the residual charge is reduced on the order of two places by controlling the potential difference between the semiconductor substrate 2901 and the stencil mask 2902. Moreover, also in the other energy condition, the residual electric charge density is closer to 0, and the energy dependency also does not exist at all.

Moreover, as shown in FIG. 28, in the case where it is controlled at the potential difference 0.1 V, the residual electric charge amount can be controlled at $1 \times 10^{10}/cm^2$.

The residual electric charge amount can be controlled by controlling the distance between the semiconductor substrate 2901 and the stencil mask 2902 as well as by controlling the potential difference between the semiconductor substrate 2901 and the stencil mask 2902.

Figure 29:
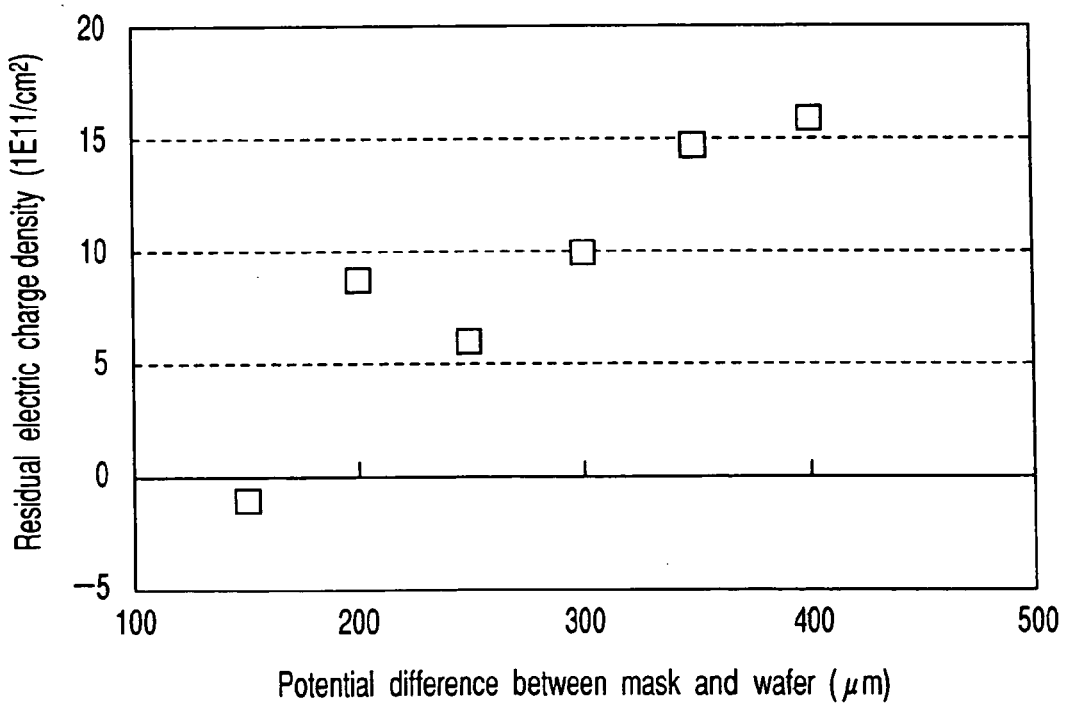
FIG. 29 is a graph showing the distance dependency between a stencil mask and the substrate to be processed with respect to the residual electric charge amount.

The results of measuring the residual electric charge amount in the case where the distance between the stencil mask 2902 and the substrate to be processed 2901 is changed in a range of from 100 to 400 µm is shown in FIG. 29. The potential difference between the substrate to be processed and the stencil mask is controlled at 0 V. The other conditions for the ion implantation are the same.

FIG. 29 is a graph showing the relationship of distance dependency between the residual electric charge amounts of the substrate to be processed 2901 and the stencil mask 2902.

From the results showing in FIG. 29, it is determined that the residual charge can be controlled by changing the distance between the semiconductor substrate 2901 and the stencil mask 2902. Moreover, if the distance between the semiconductor substrate 2901 and the stencil mask 2902 is set at 100 µm on the basis of the distance dependency of the residual electric charges, it is understood that it is possible enough to control the residual electric charge amount to be $5 \times 10^{10}/cm^2$.

Figure 30:
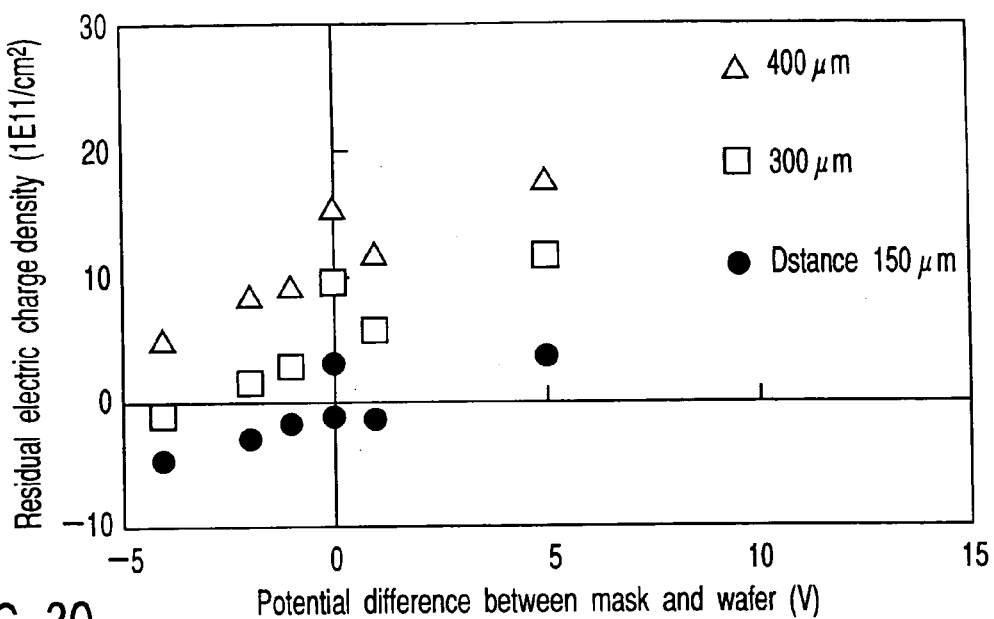
FIG. 30 is a graph showing the potential difference and distance dependency between a semiconductor substrate and a stencil mask with respect to the residual electric charge amount.

Next, the residual electric charge amount of the substrate to be processed is measured in the case where both of the distance and the potential difference between the semiconductor substrate 2901 and the stencil mask 2902 are changed. The potential difference between the semiconductor substrate 2901 and the stencil mask 2902 is changed in a range of from −4 V to +10 V, and the distance between the semi-conductor substrate 2901 and the stencil mask 2902 is changed in a range of from 150 µm to 400 µm. The other conditions are the same. The measurement results are shown in FIG. 30. FIG. 30 is a characteristic view showing the potential difference and the distance dependency between the semiconductor substrate 2901 and the stencil mask 2902 with respect to the residual electric charge amount. From the results shown in FIG. 30, it is understood that the residual electric charge density as an electric charge amount can be controlled by simultaneously controlling the potential difference and the distance.

Figure 31:
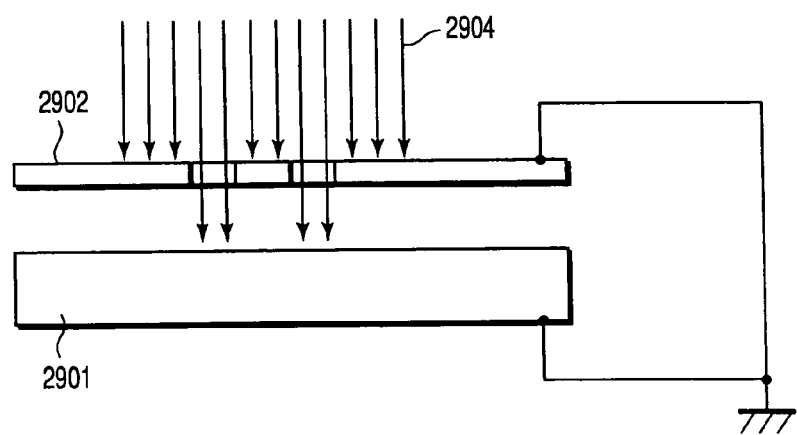
FIG. 31 is a diagram showing a modified example of an ion implantation process of the eighteenth embodiment of the present invention.

As shown in FIG. 31, except for the electrical source 2905, the stencil mask 2902 and the semi-conductor substrate 2901 may be directly electrically connected to the outer side wall of the device which is grounded. In this case, the stencil mask 2902 and the semiconductor substrate 2901 can be stably made to be the identical potential level (0 V), and further, the potential difference with the outer wall of the device can be set to a certain constant, therefore, the amount of electrification can be more stably and easily controlled.

Figure 32:
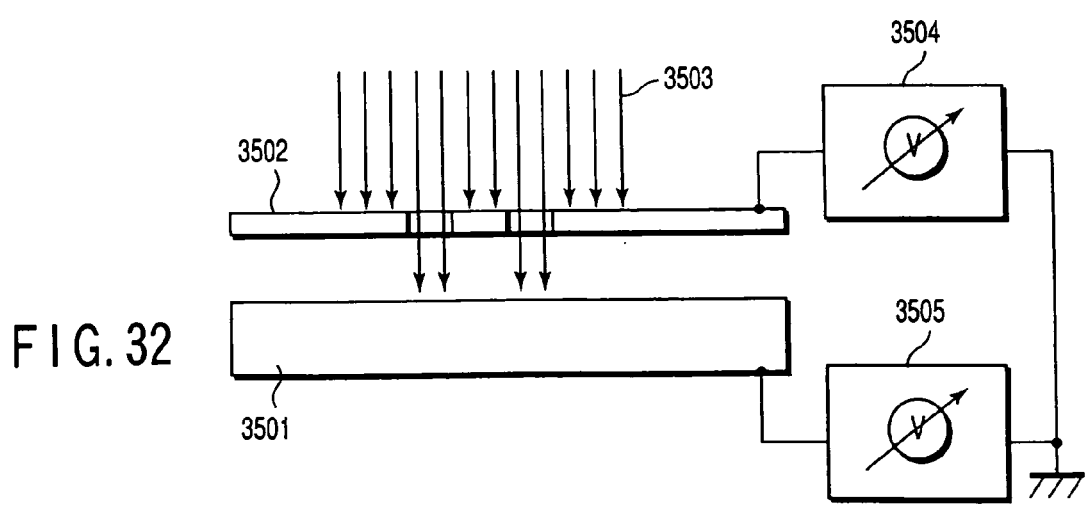
FIG. 32 is a diagram showing a modified embodiment of the ion implantation process according to the eighteenth embodiment of the present invention.

Moreover, an example of individually controlling the potential of the substrate to be processed and the stencil mask by making the outer wall of the device or ground as reference is shown in FIG. 32. Since at the time of irradiating an ion beam 3503, the potentials of the outer wall of the device (or ground) and a stencil mask 3502 are individually controlled by an electrical source 3505, and the potentials of the outer wall of the device and a semiconductor substrate 3501 can be individually controlled, the amount of electrification can be more stably controlled.

Nineteenth Embodiment

In the present embodiment, a method for manufacturing a semiconductor device in which the in-plane distribution of the whole particles including in-plane ions and neutral particles is uniformly done, and an irradiation of an ion beam is performed to a semiconductor substrate will be described below.

Figure 33:
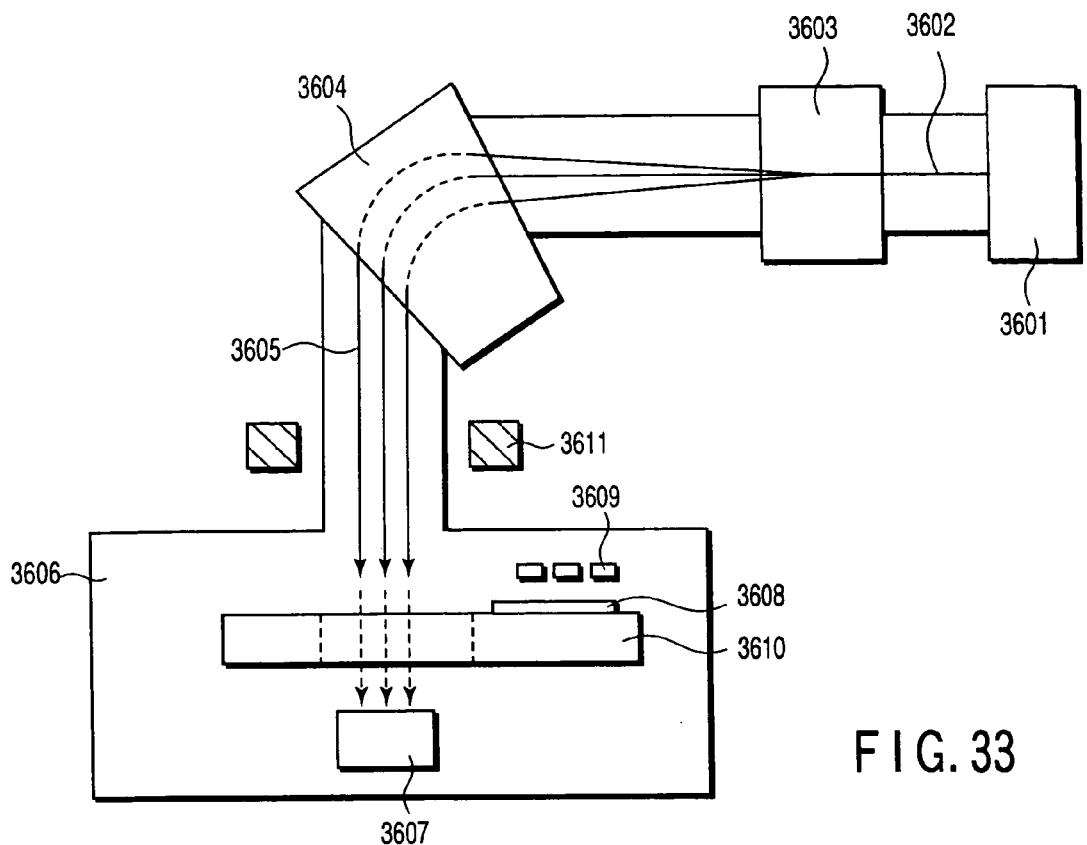
FIG. 33 is a schematic diagram showing a configuration of apparatus for manufacturing a semiconductor device according to a nineteenth embodiment of the present invention.

Prior to the description concerning with the method for manufacturing a semiconductor device, the configuration of the apparatus for manufacturing a semiconductor device will be described below with reference to FIG. 33. FIG. 33 is a diagram showing a schematic configuration of a apparatus for manufacturing a semiconductor device according to a nineteenth embodiment of the present invention.

As shown in FIG. 33, an ion beam 3602 which is generated in an ion source 3601, accelerated to the desired energy and weight/energy analyzed and taken out passes through a scanner 3603 and a magnet 3604 is formed as the parallel ion beam 3605 having the desired width, and introduced into an end station portion 3606 for performing an ion implantation into a semiconductor substrate 3608 internally installed.

Here, a particle amount measurement device 3607 configured by a MCP with fluorescent plate and a CCD camera has been previously installed immediately below the irradiation position to the semiconductor substrate 3608. The spatial distribution of the amount of particles irradiated on the semiconductor substrate 3608 can be measured by introducing the parallel ion beam 3605 in a state where the semiconductor substrate 3608 and the stencil mask 3609 installed on an XY stage 3610 are backed and avoided from the irradiation position. Moreover, a beam current measurement device 3611 for measuring a beam current such as side faraday is provided.

Figure 34:
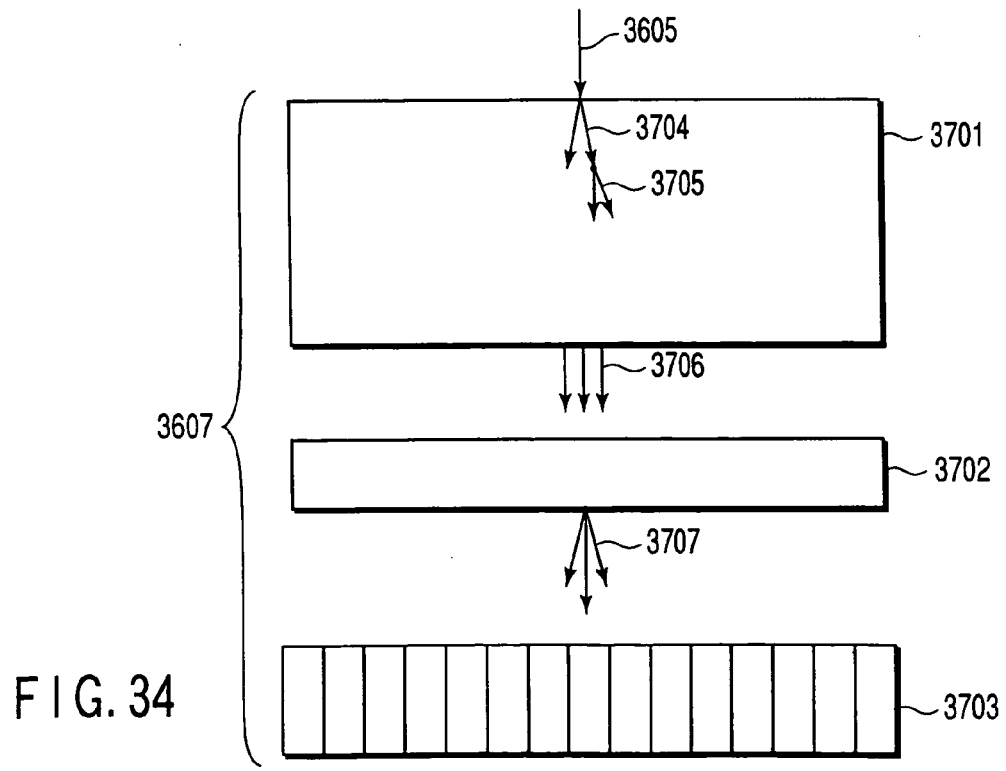
FIG. 34 is a schematic diagram showing a configuration of a particle amount measurement device according to the nineteenth embodiment of the present invention.

The configuration of the particle amount measurement device 3607 will be described below with reference to FIG. 34. As shown in FIG. 34, a particle amplification detector 3701 for the secondary electron 3704 corresponding to the amount and position of the particles such as an electric charged particle, a neutral particle, a photon and the like colliding with the measurement surface is generated, the generated secondary electron 3705 is amplified, and outputs a secondary electron 3706 from the back surface is provided on the downstream side of the parallel ion beam 3605. As the particle amplification detector 3701, a multi-channel plate and a multi-sphere plate are used. A fluorescent plate 3702 is provided on the downstream side of the secondary electron outputted from the particle amplification detector 3701. A CCD camera 3703 for detecting a strength distribution of a light 3707 emitted by the fluorescent plate 3702 due to the second electron collision is provided.

This measurement device 3607 is capable of measuring the two dimensional distribution of the amount of particles included in the ion beam by measuring a light intensity distribution of the fluorescence corresponding to the amount of the secondary electrons generated and amplified corresponding to the amount of particles and the collision position. Instead of the fluorescent plate 3702 and CCD camera 3703, it is possible that the light-sensitive film is set on the rear surface side of the particle amplification detector 3701, after the light-sensitive film is sensitized by the secondary electron outputted from the particle amplification detector 3701, the distribution of the total particle amount incident to the particle amplification detector 3701 by developing the sensitive-film.

The distribution of the neutral particles can be also measured by employing a multi-channel plate and a multi-sphere plate as a particle amplification detector. Therefore, the amount of the particles acting to the semiconductor substrate can be more precisely measured.

Moreover, a region necessary to be measured can be limited by limiting the a region in which an ion moves to come into a chip size using a stencil mask and the XY stage, and the particle amount measurement device 3607 can be easily installed. In the present embodiment, although the particle amount measurement device 3607 is installed below the XY stage 3610 to which a semiconductor substrate is moved, it may be available that the particle amount measurement device 3607 is movable and after the measurement is performed, the particle amount measurement device 3607 may be backed and avoided from irradiation position at the time of substrate processing.

Figure 35:
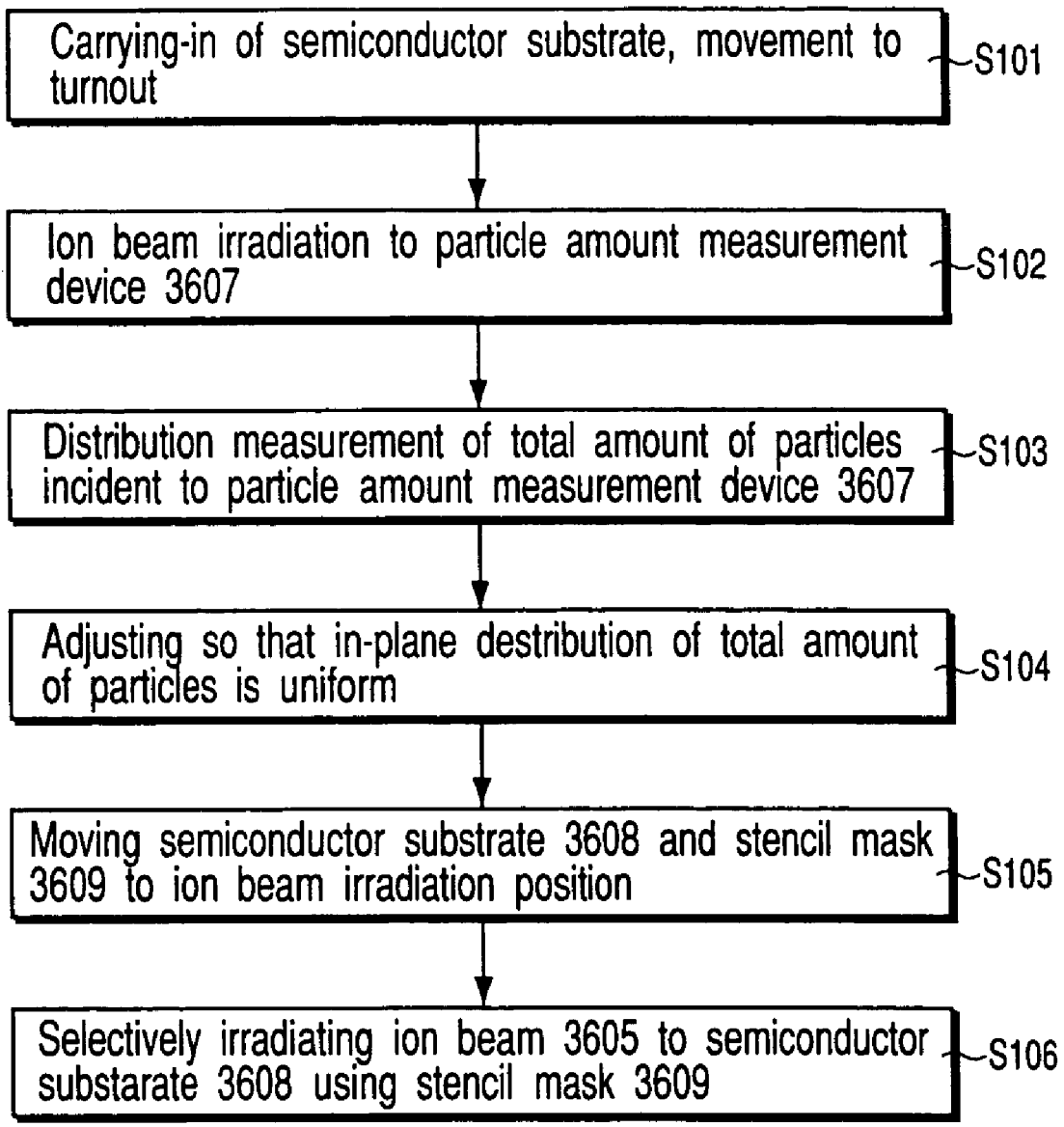
FIG. 35 is a flowchart for illustrating a manufacturing process of a semiconductor device according to the nineteenth embodiment of the present invention.

A method for manufacturing a semiconductor device using the measurement device described above will be described below. FIG. 35 is a flowchart for illustrating a method for manufacturing a semiconductor device according to the nineteenth embodiment of the present invention.

(Step S101)

First, a semiconductor substrate is carried in an end station portion 3606. A semiconductor substrate 3608 has been previously backed and avoided from the irradiation position within the end station portion 3606 but in a turnout position where a parallel ion beam 3605 is not irradiated. The stencil mask 3609 has been also previously backed and avoided from irradiation position in a turnout position. It is preferable that the adjustment of the parallel ion beam 3605 is performed immediately before the irradiation of the parallel ion beam 3605. Hence, the semiconductor substrate 3608 has been previously carried within the end station portion 3606 and is backed and avoided from the irradiation position of the parallel ion beam 3605.

(Step S102)

Subsequently, the parallel ion beam 3605 is irradiated to the measurement surface of the particle amount measurement device 3607.

(Step S103)

The in-plane distribution of the total particle amount of the ions and neutral particles included in the parallel ion beam 3605 is found by the particle amount measurement device 3607.

(Step S104)

The ion source 3601, the scanner 3603, and the magnet 3604 are adjusted so that the in-plane distribution of the total particle amount, which has been found, is uniform.

(Step S105)

After it is set so that an ion beam is not irradiated to the substrate to be processed by shielding an ion beam with a shutter, or by stopping the irradiation of the ion beam, the semiconductor substrate 3608 and the stencil mask 3609 are moved to the ion beam irradiation position by the XY stage 3610.

(Step S106)

The parallel ion beam 3605 is irradiated to the semiconductor substrate 3608 using the stencil mask 3609, and an impurity is implanted into the semiconductor substrate 3608.

In the method for manufacturing a semiconductor device described above, after the in-plane distribution of the total particle amount of ions and neutral particles is measured and the ion source 3601, the scanner 3603 and the magnet 3604 are adjusted so that the measured in-plane distribution is uniform, the in-plane distribution of the impurity implanted into the semiconductor substrate 3608 can be uniform by irradiating the parallel ion beam 3605 to the semiconductor substrate 3608.

Twentieth Embodiment

In an ion implantation process in the manufacturing of semiconductor, since the electric characteristics of a semiconductor element are varied by the variation of the impurity implantation amount, it is required to precisely measure the amount of impurity implanted into a substrate to be processed.

When the particle amount measurement device 3607 described in the nineteenth embodiment and a beam current measurement device 3611 are combined to use, the amount of impurity implanted into the semiconductor substrate 3608 is measured in situ, and the variation of the irradiation can be suppressed.

The desired amount of impurity can be precisely implanted into the semiconductor substrate 3608 by determining before the processing the correlation between the measured value of the particle amount measurement device 3607 and the measured value of the beam current measurement device 3611 capable of measuring an ion current during the implantation processing.

Figure 36:
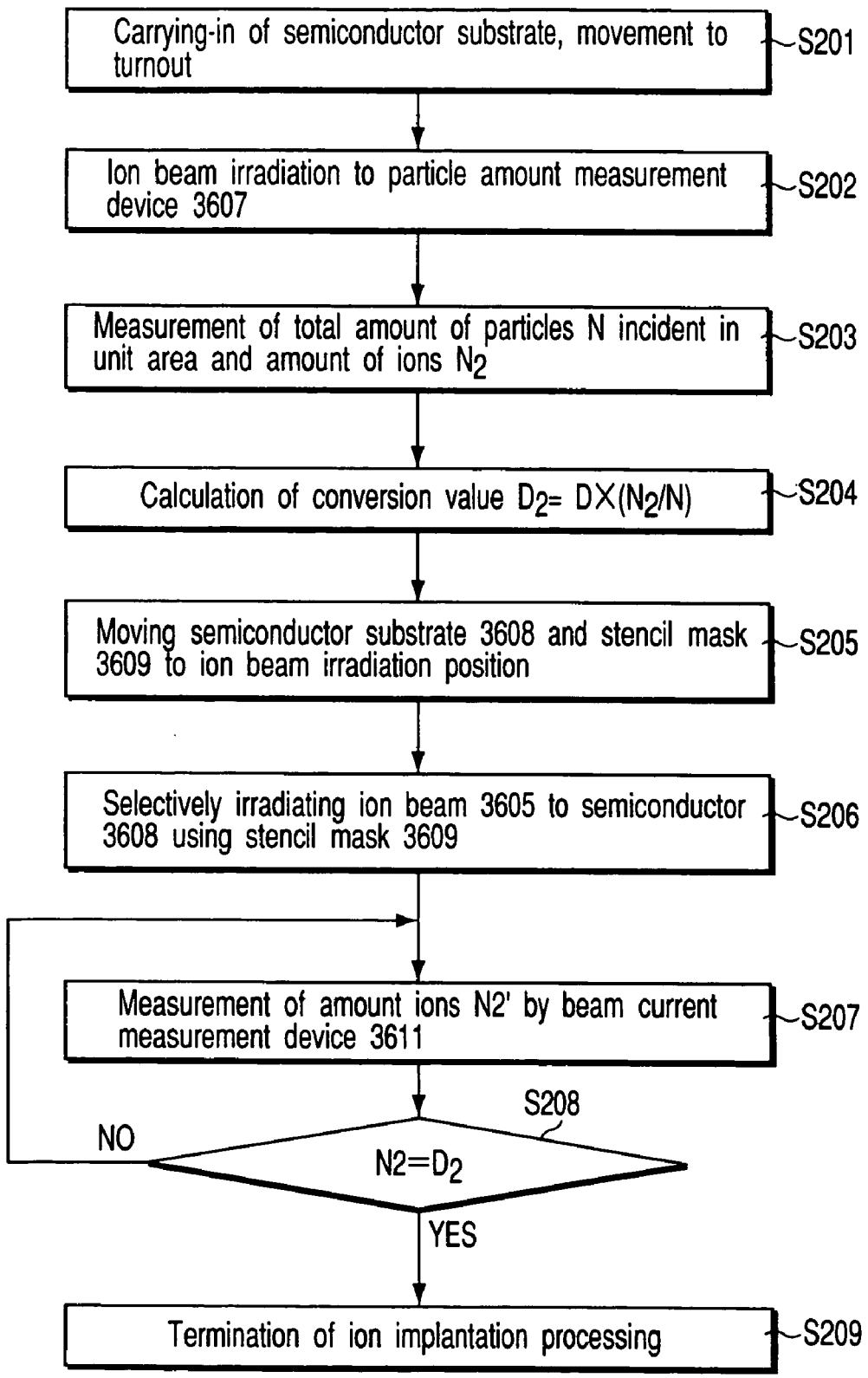
FIG. 36 is a flowchart for illustrating a manufacturing process of a semiconductor device according to a twentieth embodiment of the present invention.

Hereinafter, a method for manufacturing a semiconductor device in which the particle amount measurement device 3607 and the beam current measurement device 3611 are combined will be described with reference to FIG. 36. FIG. 36 is a flowchart used for illustrating a manufacturing process of a semi-conductor device according to a twentieth embodiment of the present invention.

(Step S201)

First, a semiconductor substrate 3608 is carried in an end station portion 3606. The semiconductor substrate 3608 has been previously backed and avoided from the irradiation position within the end station portion 3606 but in a turnout position where a parallel ion beam 3605 is not irradiated. A stencil mask 3609 has been also previously backed and avoided from the irradiation position in a turnout position. The state of the parallel ion beam 3605 is changed depending on the environment within the end station portion 3606. Therefore, it is preferable that the correlation between the measurement value of the particle amount measurement device 3607 and the measurement value of the beam current measurement device 3611 is performed immediately before the irradiation of the parallel ion beam 3605 to the semiconductor substrate 3608. Hence, the semiconductor substrate 3608 has been previously carried within the end station portion 3606 and is backed and avoided from the irradiation position of the parallel ion beam 3605.

(Step S202)

Subsequently, the parallel ion beam 3605 is irradiated to the measurement surface of the particle amount measurement device 3607.

(Step S203)

The amount of ions $N_2$ is measured by the beam current measurement device 3611 as well as the total amount of the particles N incident to the unit area of the measured surface by the particle amount measurement device 3607 of the present invention immediately before the ion implantation is performed into the semiconductor substrate 3608. Where instead of the amount of ion $N_2$, the ion current is measured whenever the occasion demands during the ion irradiation, and the value may be a value of which the amount of electric current is simply integrated.

(Step S204)

The conversion value $D_2 = D \times (N_2/N)$ is found using two measured values N and $N_2$ with respect to the desired amount of implantation D.

(Step S205)

After the parallel ion beam 3605 is not irradiated to the semiconductor substrate 3608 by shielding the parallel ion beam 3605 with a shutter, or by stopping the irradiation of the parallel ion beam 3605 once, the semiconductor substrate 3608 and the stencil mask 3609 are moved to the ion beam irradiation position.

(Step S206)

The parallel ion beam 3605 is selectively irradiated to the semiconductor substrate 3608 using the stencil mask 3609, and an impurity is implanted into the semiconductor substrate 3608.

(Step S207)

The amount of ion $N_2'$ is measured by the beam current measurement device 3611 at the time when an impurity is implanted.

(Step S208)

Whether or not the measured amount of ion $N_2'$ is equal to the conversion value $D_2$ is determined.

(Step S209)

At the time when that the amount of ion $N_2'$ is equal to the conversion value $D_2$ is determined, the ion implantation processing is terminated.

As described above, if the appropriate conversion value $D_2$ previously have been found immediately before the processing is performed, at the time when the amount of ion $N_2'$ is the conversion value $D_2$ at the time of ion irradiation, the amount of implantation can be precisely controlled without depending on the state of device by stopping the ion irradiation processing, and the variation of the electric characteristics of the semiconductor element can be suppressed.

As the beam current measurement device 3611 capable of measuring the ion current during the implantation processing, there is, for example, a measurement device what is called a side faraday. This is to measure the amount of current of a portion of the end of the ion beam spatially spread, which does not act to the substrate to be processed.

Twenty-First Embodiment

Figure 37:
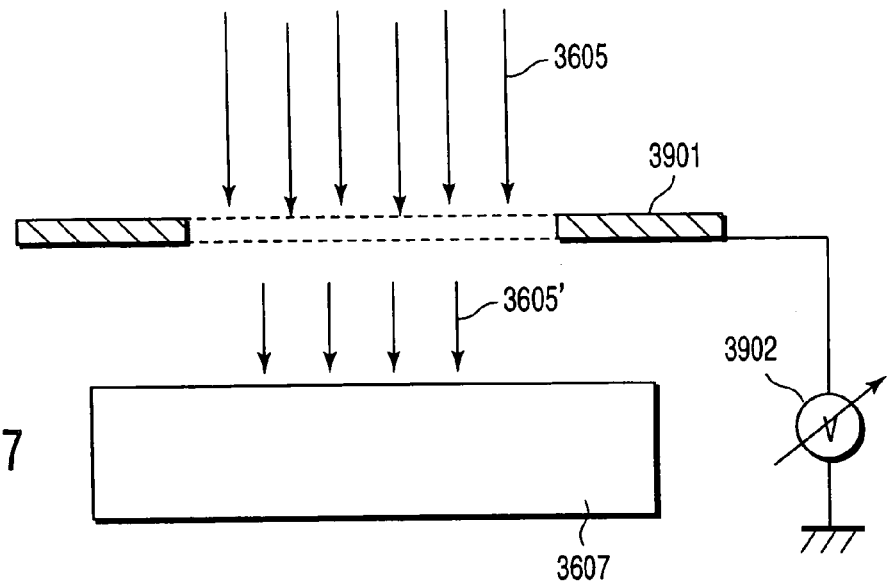
FIG. 37 is a schematic diagram showing a configuration of a particle amount measurement device according to a twenty-first embodiment of the present invention.
Figure 38:
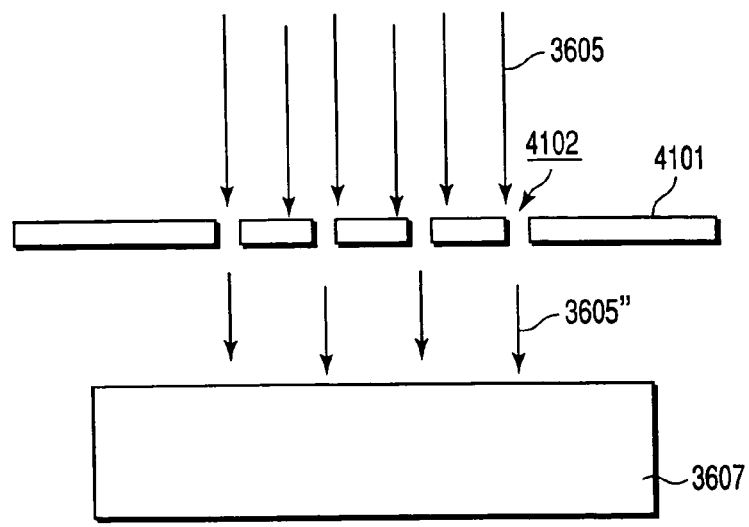
FIG. 38 is a schematic diagram showing a configuration of a particle amount measurement device according to a twenty-second embodiment of the present invention.
Figure 39:
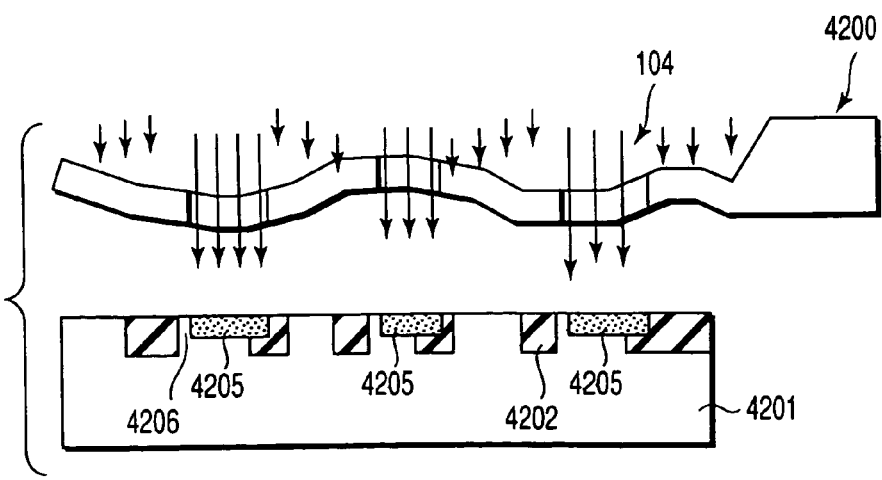
FIG. 39 is a diagram showing a state of affairs in which an ion implantation process is performed using a conventional stencil mask.

Next, an embodiment in which particles and neutral particles having a specific energy can be solely measured by providing an electrode in front of a particle amount measurement device 3607 will be described below with reference to FIG. 37. As shown in FIG. 38, in front of the particle amount measurement device 3607, an electrode 3901 capable of applying a given potential by an electric source 3902 is installed. In a state of not applying the potential to the electrode 3901, all the particles included in a parallel ion beam 3605 pass through the electrode 3901, and the particles 3605' which have passed through the electrode 3901 are measured by the particle amount measurement device 3607.

Now, assuming that the valence of particle is +q, when a potential E is given to the electrode 3901, an ion having a small kinetic energy less than qE cannot pass through the electrode 3901. The particles 3605' passing through the electrode 3901 and measured by the particle amount measurement device 3607 are neutral particles or its kinetic energy being exceeded over qE. The state of energy of particles reached to the semiconductor substrate during the processing can be confirmed in more detail by changing the voltages applied to the electrode 3901 and by confirming the spatial distribution and amount of signals of the particles 3605' measured by the particle amount measurement device 3607.

Particularly, in the ion implantation, since the depth of the implantation depends on the kinetic energy which the particle has (acceleration energy), and the amount of implantation and the depth of the implantation have influence on the electric characteristics of the semiconductor element, the variation of the electric characteristics of the semiconductor element can be reduced by confirming the kinetic energy distribution, which the particles have, prior to performing of the processing to the semiconductor substrate.

Twenty-Second Embodiment

Next, an embodiment in which, owing to further limiting the positions, the amount of particles can be measured by installing a stencil mask having an opening in a specific region will be described below with respect to FIG. 38.

As shown in FIG. 38, now, in front of a particle amount measurement device 3607, a stencil mask 4101 in which an opening 4102 is provided in a given region is installed. Only the particles which have passed through the opening 4102 of the stencil mask 4101 are incident to the particle amount measurement device 3607. Therefore, a measurement whose spatial resolution is higher can be realized by changing the settings of the opening size of the opening 4102 of the stencil mask 4101 and the distance between the openings. Moreover, only the particles having a specific energy may be measured by applying the potential to this stencil mask 4101 and utilizing the stencil mask as the electrode 3901 described in the Twenty-first embodiment.

The present invention is not limited to the above-described each embodiment, in the carrying out stage, the present invention is capable of being deformed in a variety of forms in the scope without departing subject matter thereof. For instance, in the above-described each embodiment, although a stencil mask is used as a mask at the time of ion implantation, it is also capable of being used as a mask of etching using plasma including charged particles and the like. Moreover, it is also capable of utilizing as a mask in the X-ray (charged particle) exposure.

Furthermore, the above-described embodiments include inventions in a variety of stages, a variety of inventions are capable of being extracted by appropriate combinations in a plurality of structural requirements disclosed herein. For example, if some of the structural requirements are deleted from all the structural requirements indicated in the embodiments, in the case where at least one of the problems described in the column of "Problem to be solved by the invention" can be solved and at least one of the effects described in the column of "Effects of the invention" can be obtained, the structure whose structural requirements thereof are deleted is capable of being extracted as the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stencil mask comprising:
   a first thin film having an opening for selectively irradiating charged particles to a substrate;
   an insulating layer formed on a first region of the first thin film, the first region being contained in an irradiation surface of the first thin film on which the charged particles are irradiated; and
   a supporting member formed on a second region of the first thin film and the insulating layer, the second region being located outside of the circumference of the first region, and the supporting substrate being electrically connected to the first thin film.

2. The stencil mask according to claim 1, wherein the first thin film and the supporting member are unified.

3. The stencil mask according to claim 1, further including a conductive film formed on an irradiation surface of the first thin film.

4. The stencil mask according to claim 3, wherein the conductive film is composed of silicide film.

5. The stencil mask according to claim 1, further including:
   a second thin film formed on an irradiation surface of the first thin film; and
   a third thin film formed on the second thin film.

6. The stencil mask according to claim 5, wherein the second thin film is composed of metal film.

7. The stencil mask according to claim 5, wherein the third thin film is composed of amorphous silicon film.

8. A stencil mask comprising:
   a first thin film having a first region and a second region, the first region including an opening for selectively irradiating charged particles to a substrate;
   an insulating layer formed on a part of the second region of the first thin film on which the charged particles are irradiated; and
   a supporting member formed on a remaining portion of the second region of the thin film and on the insulating layer, wherein the supporting member is electrically connected to the first thin film at the remaining portion.

9. The stencil mask according to claim 8, wherein the first thin film and the supporting member are unified.

10. The stencil mask according to claim 8, further including a conductive film formed on an irradiation surface of the first thin film.

11. The stencil mask according to claim 10, wherein the conductive film is composed of silicide film.

12. The stencil mask according to claim 8, further including:
    a second thin film formed on an irradiation surface of the first thin film; and
    a third thin film formed on the second thin film.

13. The stencil mask according to claim 12, wherein the second thin film is composed of metal film.

14. The stencil mask according to claim 12, wherein the third thin film is composed of amorphous silicon film.

* * * * *